(12) United States Patent
Ramaswamy et al.

(10) Patent No.: US 12,300,298 B2
(45) Date of Patent: May 13, 2025

(54) DIFFERENTIAL STORAGE IN MEMORY ARRAYS

(71) Applicant: Micron Technology, Inc., Boise, ID (US)

(72) Inventors: Durai Vishak Nirmal Ramaswamy, Boise, ID (US); Giorgio Servalli, Fara Gera d'Adda (IT); Angelo Visconti, Appiano Gentile (IT); Marcello Mariani, Milan (IT); Alessandro Calderoni, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 18/047,568

(22) Filed: Oct. 18, 2022

(65) Prior Publication Data

US 2024/0127877 A1 Apr. 18, 2024

(51) Int. Cl.
*G11C 11/22* (2006.01)
*G11C 7/06* (2006.01)

(52) U.S. Cl.
CPC .......... *G11C 11/2257* (2013.01); *G11C 7/067* (2013.01); *G11C 11/2297* (2013.01)

(58) Field of Classification Search
CPC ............................................. G11C 11/22–2297
See application file for complete search history.

(56) References Cited

U.S. PATENT DOCUMENTS

| 2007/0236979 | A1* | 10/2007 | Takashima | H10B 53/30 |
| | | | | 257/E21.664 |
| 2021/0065763 | A1* | 3/2021 | Di Vincenzo | G11C 11/2257 |
| 2021/0183873 | A1* | 6/2021 | Goodwin | H10B 53/20 |

* cited by examiner

*Primary Examiner* — Alfredo Bermudez Lozada
(74) *Attorney, Agent, or Firm* — Holland & Hart LLP

(57) ABSTRACT

Methods, systems, and devices for differential storage in memory arrays are described. A memory device may include pairs of memory cells configured to store a single logic state (e.g., a single bit of information). Additionally, the memory device may include sense amplifiers configured to sense the logic state based on a difference between a voltage of a first ferroelectric memory cell of the pair of memory cells and a voltage of a second ferroelectric memory cell of the pair of memory cells. In one example, the memory device may include pairs of memory cells within a single memory array on a single level. Here, each memory cell pair may include a memory cells that are each coupled with a same word line and plate line. Additionally, each memory cell pair may include memory cells each coupled with different digit lines.

25 Claims, 8 Drawing Sheets

DIFFERENTIAL STORAGE IN MEMORY ARRAYS

FIELD OF TECHNOLOGY

The following relates to one or more systems for memory, including differential storage in memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

Figure 1:
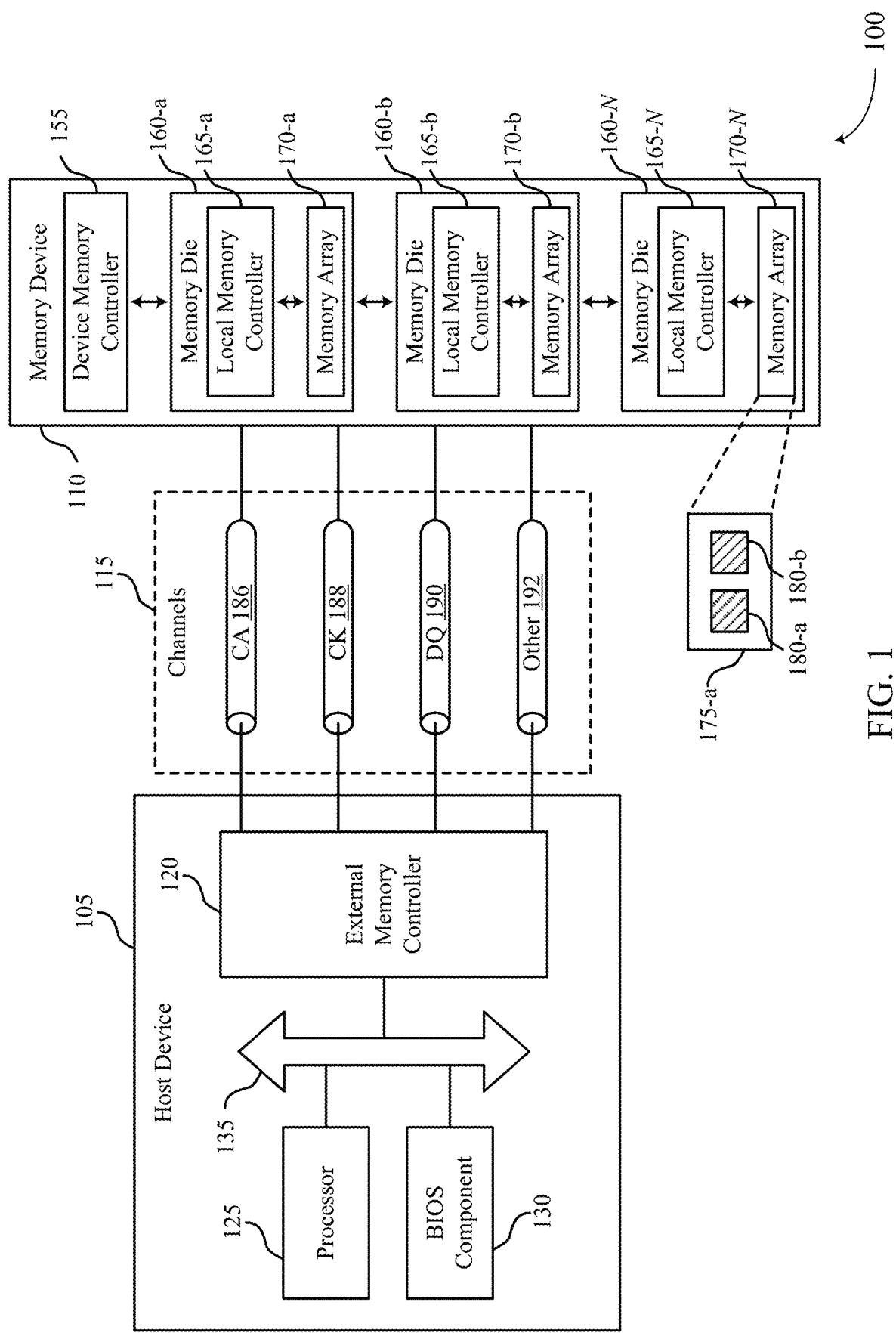
FIG. 1 illustrates an example of a system that supports differential storage in memory arrays in accordance with examples as disclosed herein.

A memory device may include one or more memory arrays to store data. In some examples, the memory device may store a logic state at a memory cell in the memory array. In some examples (e.g., due to manufacturing and physical characteristic deviations), a threshold voltage of one memory cell storing a logic state may be different than a threshold voltage of another memory cell storing the same logic state. Accordingly, memory cells within an array that each store a given logic state may be associated with a range or distribution of respective threshold voltages. In some examples, a distribution of threshold voltages for memory cells storing the first logic state may overlap with a distribution for memory cells storing the second logic state. In such examples, applying a reference voltage to determine if a memory cell is storing a first logic state or a second logic state may be difficult (e.g., the reference voltage may be below a lowest threshold voltage of a memory cell storing the first logic state and above a highest threshold voltage of a memory cell storing the second logic state). This may cause inaccurate sensing of memory cells in the memory device.

As described herein, a memory device may include pairs of memory cells that store a single bit of information or data. In such examples, the memory device may include a sense amplifier configured to sense a logic state based on a difference between a voltage of a first memory cell of the pair of memory cells and a voltage of a second memory cell of the pair of memory cells. Accordingly, the memory device may activate both the first memory cell and the second memory cell and transfer charge to a first digit line coupled with the first memory cell and charge to a second digit line coupled with the second memory cell. The digit lines may carry the charge to the sense amplifier, which may detect a single bit of information stored by the first memory cell and the second memory cell based on the difference between the voltage on the first digit line and the second digit line. The position of the memory cells in the pair of memory cells relative to each other in the memory array may impact the accuracy of sensing the states. For example, the closer in proximity the two memory cells of the pair of memory cells are in the memory array may cause the cells to share similar variations that may occur during processing. In such examples, each of the two cells may have similar characteristics, which may lead to them storing information in a similar manner and increasing the accuracy of the stored information. In other examples, if memory cells of the pair of memory cells share common access lines, it may increase the accuracy of the stored information.

In some cases, the memory device may include pairs of memory cells within a single memory array (e.g., that is on a single level). In this case, each memory cell in the memory cell pair may be coupled with a same word line and a same plate line and a first memory cell in the pair may be coupled with a first digit line and a second memory cell in the pair may be coupled with a second digit line (e.g., different than the first digit line). In some other cases, the memory device may include pairs of memory cells including a first memory cell in a first memory array and a second memory cell in a second memory array. In one example, each memory cell pair may include a first memory cell in a first memory array and a second memory cell in a second memory array positioned adjacent to the first memory array (e.g., and on a same level as the first memory array). In this example, each memory cell pair may include memory cells coupled with different word line, plate line, and digit line. In another example, each memory cell pair may include a first memory cell in a first memory array a second memory cell in as second memory array positioned above the first memory array (e.g., and on a different level than the first memory array). In this example, each memory cell in the memory cell pair may be coupled with a same word line and a first memory cell in the pair may be coupled with a first digit line and a first plate line and a second memory cell in the pair may be coupled with a second digit line and a second plate line (e.g., different than the first digit line and first plate line).

Figure 2:
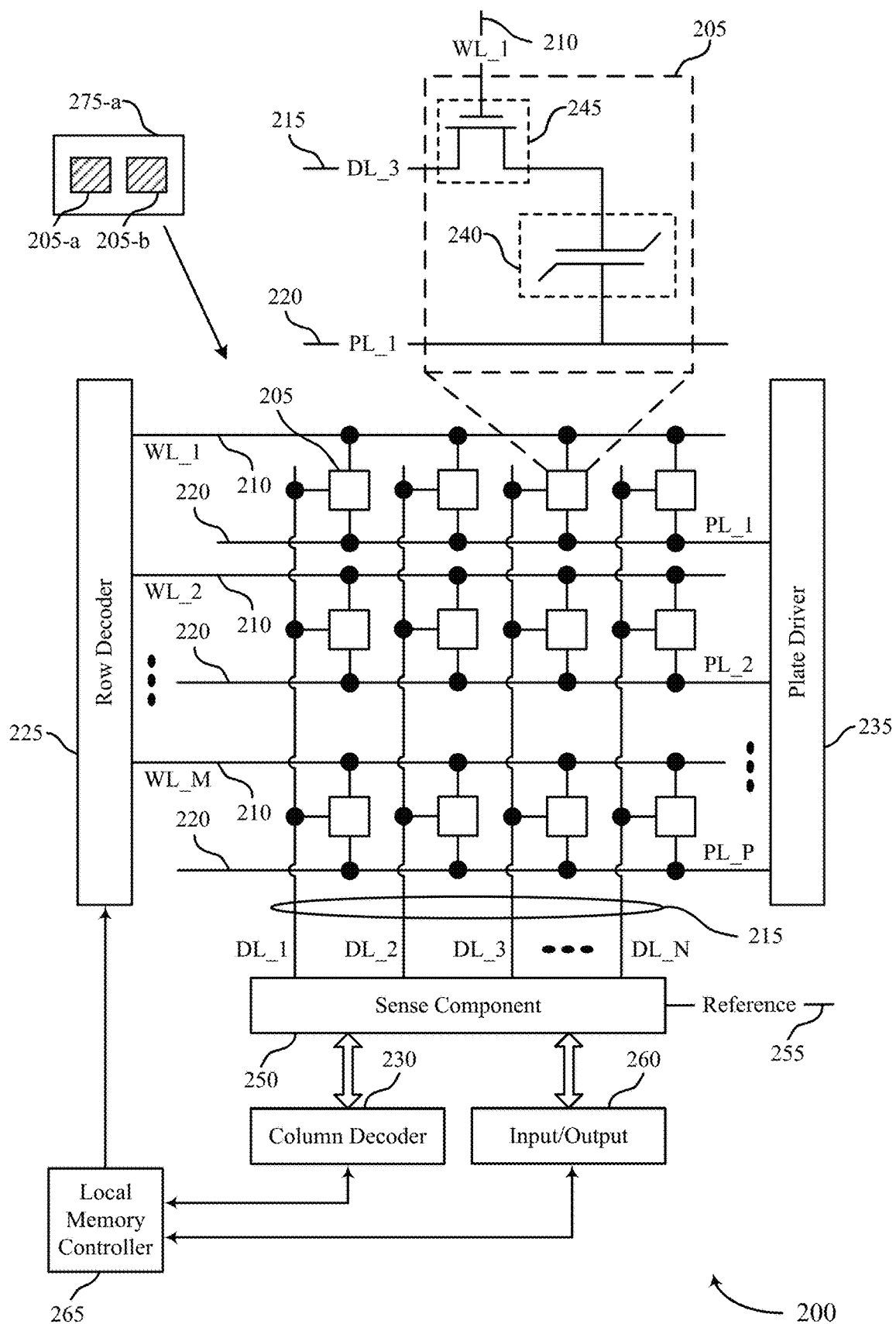
FIG. 2 illustrates an example of a memory die that supports differential storage in memory arrays in accordance with examples as disclosed herein.

Features of the disclosure are initially described in the context of systems and dies with reference to FIGS. 1 and 2. Features of the disclosure are described in the context of hysteresis curves, memory array configurations, and memory dies with reference to FIGS. 3 through 8.

FIG. 1 illustrates an example of a system 100 that supports differential storage in memory arrays in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100. In some cases, the memory device 110 may be referred to as a memory sub-system or a memory system.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

A memory die 160 may include pairs of memory cells that store a single bit of information or data. In such examples, the memory die 160 may include a sense amplifier configured to sense a logic state based on a difference between a voltage of a first memory cell 180-*a* of the pair 175-*a* of memory cells and a voltage of a second memory cell 180-*b* of the pair 175-*a* of memory cells. Accordingly, the memory die 160 may activate both the first memory cell 180-*a* and the second memory cell 180-*b* and transfer charge to a first digit line coupled with the first memory cell 180-*a* and charge to a second digit line coupled with the second memory cell 180-*b*. The digit lines may carry the charge to the sense amplifier, which may detect a single bit of information stored by the first memory cell 180-*a* and the second memory cell 180-*b* based on the difference between the voltage on the first digit line and the second digit line.

In some cases, the memory die 160 may include pairs 175 of memory cells within a single memory array 170 (e.g., within a 2D array of memory cells, within a single memory array 170 of a 3D memory die 160). In this case, each memory cell 180 in the memory cell pair 175-*a* may be coupled with a same word line and a same plate line and a first memory cell 180-*a* in the pair may be coupled with a first digit line and a second memory cell 180-*b* in the pair may be coupled with a second digit line (e.g., different than the first digit line). In some other cases, the memory die 160 may include pairs 175 of memory cells including a first memory cell 180-*a* in a first memory array 170 and a second memory cell 180-*b* in a second memory array 170. In one example, each memory cell pair 175 may include a first memory cell 180-*a* in a first memory array 170 and a second memory cell 180-*b* in a second memory array 170 positioned adjacent to the first memory array 170 (e.g., and on a same level as the first memory array 170). In this example, each memory cell pair 175 may include memory cells 180 coupled with different word line, plate line, and digit line. In another example, each memory cell pair 175 may include a first memory cell 180-*a* in a first memory array 170 a second memory cell 180-*b* in as second memory array 170 positioned above the first memory array 170 (e.g., and on a different level than the first memory array 170). In this example, each memory cell 180 in the memory cell pair 175 may be coupled with a same word line and a first memory cell 180-*a* in the pair may be coupled with a first digit line and a first plate line and a second memory cell 180-*b* in the pair may be coupled with a second digit line and a second plate line (e.g., different than the first digit line and first plate line).

The device memory controller 155 may include components (e.g., circuitry, logic) operable to control operation of the memory device 110. The device memory controller 155 may include hardware or firmware (e.g., which may include instructions) that enable the memory device 110 to perform various operations and may be operable to receive, transmit, or execute commands or data (e.g., including control information) related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding (e.g., including demodulating) received signals, encoders for encoding (e.g., including modulating) signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

FIG. 2 illustrates an example of a memory die 200 that supports differential storage in memory arrays in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that couples the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The memory die 200 may include pairs of memory cells 205 that store a single bit of information or data. In such examples, the memory die 200 may include a sense amplifier configured to sense a logic state based on a difference between a voltage of a first memory cell 205-*a* of the pair 275-*a* of memory cells 205 and a voltage of a second memory cell 205-*b* of the pair 275-*a* of memory cells. Accordingly, the memory die 200 may activate both the first memory cell 205-*a* and the second memory cell 205-*b* and transfer charge to a first digit line 215 coupled with the first memory cell 205-*a* and charge to a second digit line 215 coupled with the second memory cell 205-*b*. The digit lines 215 may carry the charge to the sense component 250 (e.g., a sense amplifier such as a differential amplifier), which may detect a single bit of information stored by the first memory cell 205-*a* and the second memory cell 205-*b* based on the difference between the voltage on the first digit line 215 and the second digit line 215.

In some cases, the memory die 200 may include pairs of memory cells 205 within a single memory array (e.g., within a 2D array of memory cells, within a single memory array of a 3D memory die 200). In this case, each memory cell 205 in the memory cell pair 275-*a* may be coupled with a same word line 210 and a same plate line 220 and a first memory cell 205-*a* in the pair may be coupled with a first digit line 215 and a second memory cell 205-*b* in the pair may be coupled with a second digit line 215 (e.g., different than the first digit line 215). In some other cases, the memory die 200 may include pairs 275 of memory cells 205 including a first memory cell 205-*a* in a first memory array and a second memory cell 205-*b* in a second memory array. In one example, each memory cell pair 275 may include a first memory cell 205-*a* in a first memory array and a second memory cell 205-*b* in a second memory array positioned adjacent to the first memory array (e.g., and on a same level as the first memory array). In this example, each memory cell pair 275 may include memory cells 205 coupled with different word line 210, plate line 220, and digit line 215. In another example, each memory cell pair 275 may include a first memory cell 205-*a* in a first memory array a second memory cell 205-*b* in as second memory array positioned above the first memory array (e.g., and on a different level than the first memory array). In this example, each memory cell 205 in the memory cell pair 275 may be coupled with a same word line 210 and a first memory cell 205-*a* in the pair may be coupled with a first digit line 215 and a first plate line 220 and a second memory cell 205-*b* in the pair may be coupled with a second digit line 215 and a second plate line 220 (e.g., different than the first digit line 215 and first plate line 220).

Figure 3A:
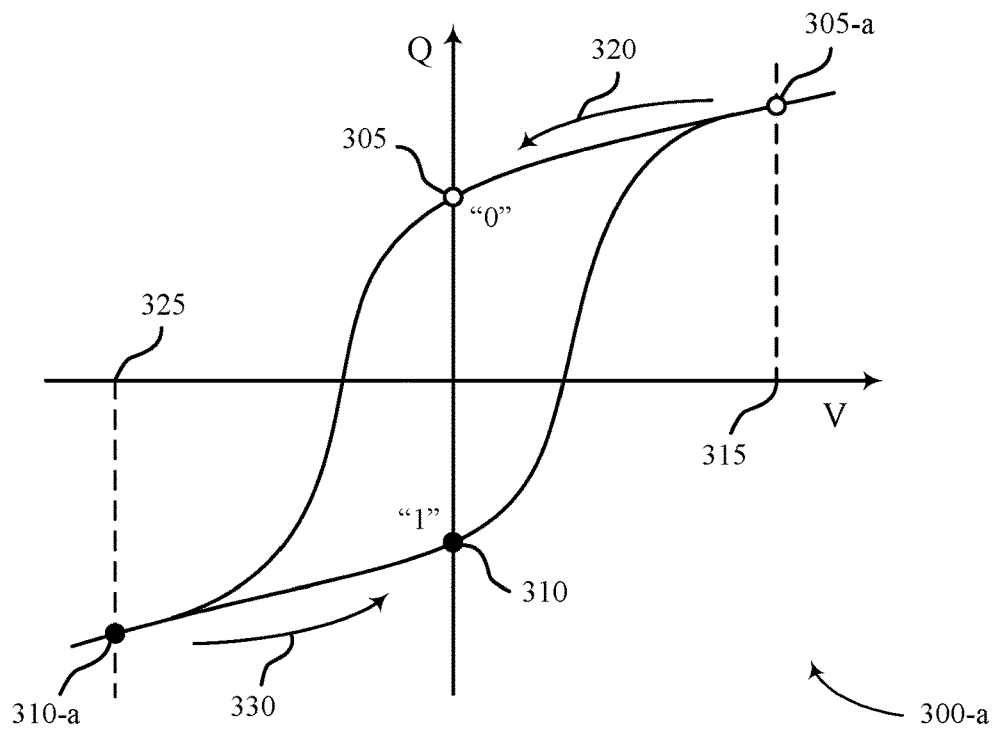
FIGS. 3A and 3B illustrate examples of hysteresis curves that support differential storage in memory arrays in accordance with examples as disclosed herein.
Figure 3B:
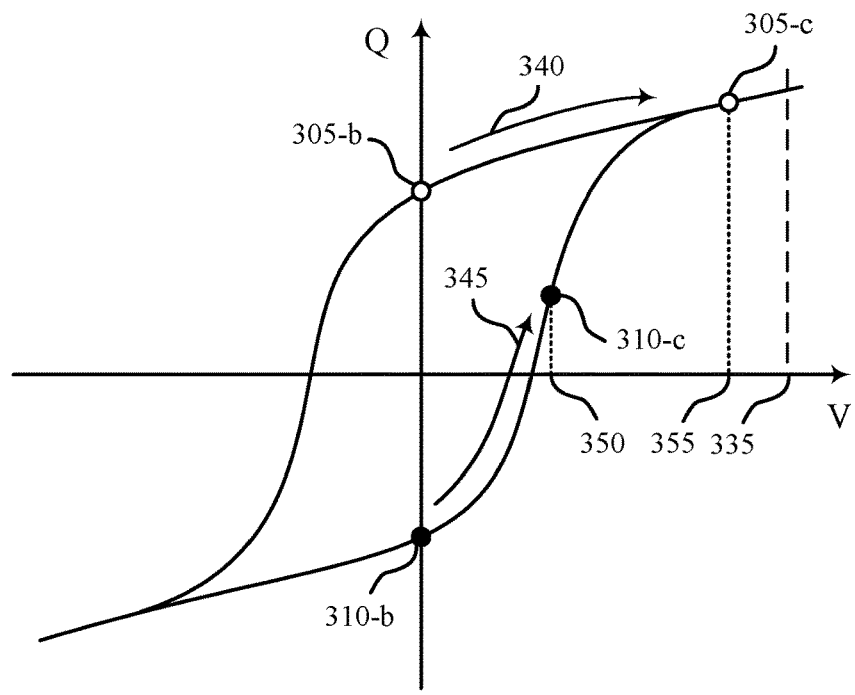

FIGS. 3A and 3B illustrate examples of non-linear electrical properties of a ferroelectric memory cell with hysteresis curves 300-*a* and 300-*b* that support differential storage in memory arrays in accordance with examples as disclosed herein. Hysteresis curves 300-*a* and 300-*b* illustrate an example ferroelectric memory cell writing and reading process, respectively. Hysteresis curves 300-*a* and 300-*b* depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO3$), lead titanate ($PbTiO3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce a quantity of refresh operations used to refresh the logic states stored in memory cells.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-*a* and 300-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

In some examples, each memory cell may be part of a memory cell pair configured to store a single bit of information (e.g., a logic 0 or 1). Here, each memory cell in the pair may be written to store opposite states. For example, a logic 0 may be written to a first memory cell of the pair and a logic 1 may be written to a second memory cell of the pair.

To read (e.g., sense) the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

In cases that each memory cell stores a single bit of information (e.g., a logic 0 or 1), the initial state of the capacitor may be determined by comparing the digit line voltage to a reference voltage. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In cases that a memory cell is part of a memory cell pair storing a single bit of information, the initial state of the capacitors (e.g., corresponding to the memory cells in the memory cell pair) may be determined by comparing a first voltage on a first digit line coupled with a first memory cell of the pair and a second voltage on a second digit line coupled with a second memory cell of the pair. The difference between the first voltage and the second voltage may be compared to determine the stored logic state. For example, the sense component may detect a first logic state if the first voltage (e.g., on the first digit line that is coupled with the first memory cell of the pair) is greater than the second voltage (e.g., on the second digit line that is coupled with the second memory cell of the pair). Additionally, the sense component may detect a second logic state if the first voltage is less than the second voltage.

In some cases, differential sensing may be associated with a larger read window (e.g., a difference between compared voltages) as compared to sensing operations that are based on a comparing a single digit line voltage with a reference voltage. For example, differential sensing may be associated with a read window that is twice as large as a read window associated with a sensing operation that is based on comparing the single digit line voltage with a reference voltage. Additionally, differential sensing may be associated with less common mode noise and variability as compared to sensing operations based on comparing a single digit line voltage with a reference voltage. Thus, differential sensing may be associated with increased reliability as compared to sensing operations that are based on comparing a single digit line voltage with a reference voltage. Differential sensing (sometimes referred to as differential storage) may include storing two complementary states in two memory cells of a pair of memory cells. The combination of the two complementary states (e.g., the differential pair) may reduce a likelihood of errors in the resulting information.

In some cases, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-*b* and the charge state 310-*b*. A read voltage 335 may be applied, for example, as a voltage difference via a digit line 215 and a plate line 220 as described with reference to FIG. 2. Hysteresis curve 300-*b* may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-*a* (e.g., a logic 1) or at charge state 310-*a* (e.g., a logic 0).

Figure 4:
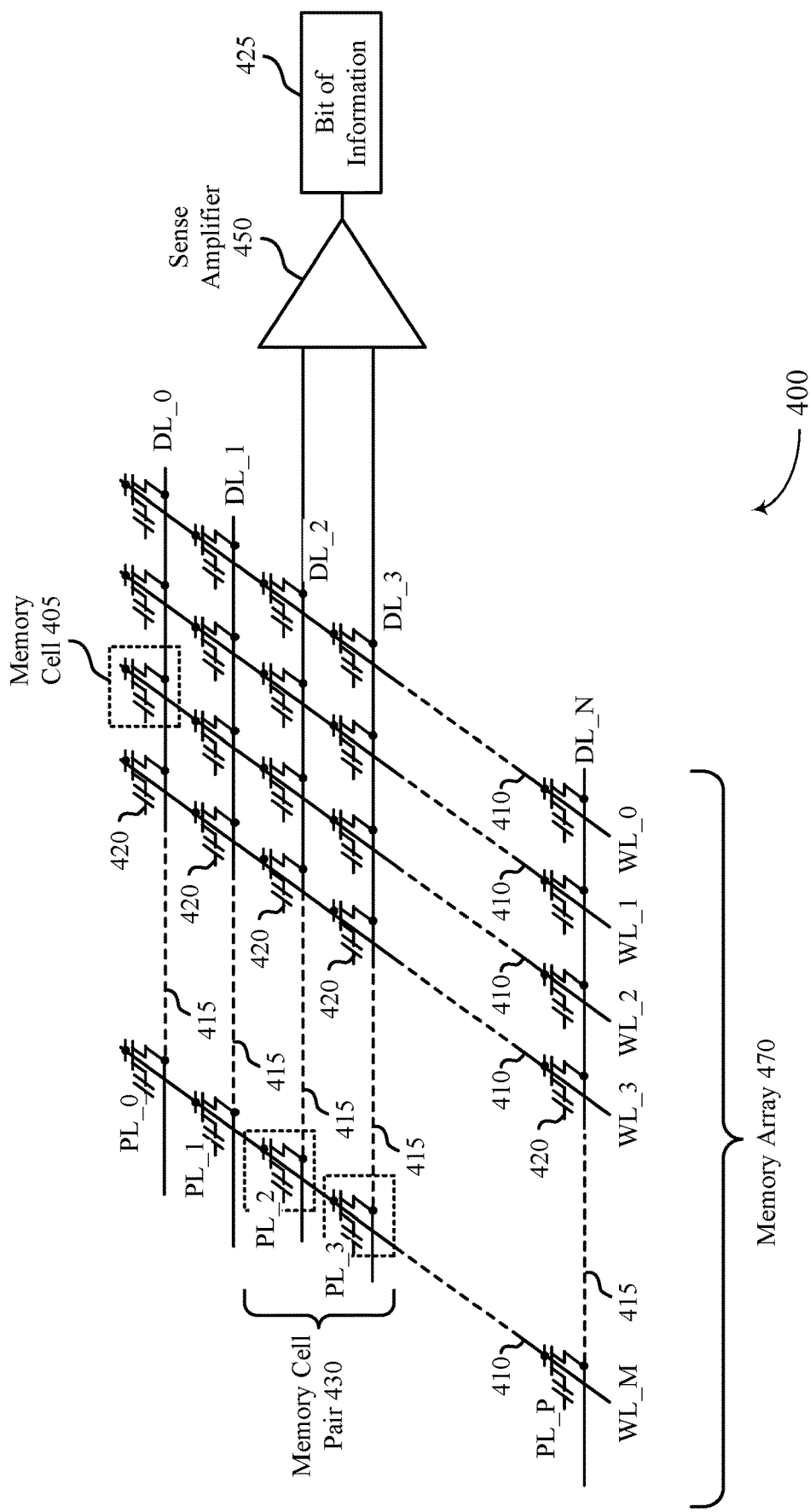
FIGS. 4 through 6 illustrate examples of memory array configurations that support differential storage in memory arrays in accordance with examples as disclosed herein.

FIG. 4 illustrates an example of a memory array configuration 400 that supports differential storage in memory arrays in accordance with examples as disclosed herein. The memory array configuration 400 may include aspects of the systems, memory dies, and hysteresis curves as described with reference to FIGS. 1 through 3. For example, the memory array 470, memory cell 405, word lines 410, digit lines 415, and plate lines 420 may be examples of memory arrays, memory cells, word lines, digit lines, and plate lines, respectively, as described with reference to FIGS. 1 through 3. The memory array configuration 400 may additionally include memory cell pairs 430, which may be programmed and sensed as described with reference to FIGS. 3A and 3B. The memory array configuration 400 may additionally include a sense amplifier 450, which may be an example of sense amplifiers and sense components as described with reference to FIGS. 1 through 3.

The memory array 470 may be included on a memory die (e.g., as described with reference to FIGS. 1 and 2). In some cases, the memory array 470 may be a 2D memory array 470 or the memory array 470 may be a portion of a 3D memory array (e.g., positioned above or below one or more additionally memory arrays 470). Here, the 3D memory array may include two or more memory arrays 470 (e.g., similar to the memory array 470 illustrated in the memory array configuration 400) positioned vertically over one another.

The memory array 470 may include memory cells 405 positioned at intersections of the word lines 410 and the digit lines 415 and the plate lines 420. In some cases, each memory cell 405 may include a capacitor and a switching component (e.g., as described with reference to FIG. 2). Additionally, each memory cell 405 may be a part of a memory cell pair 430. That is, each memory cell 405 may, in conjunction with another memory cell 405 that is a part of a same memory cell pair 430, store a single bit of information 425. For example, if a first memory cell 405 in the memory cell pair 430 stores one logic state (e.g., a 0), the second memory cell 405 in the memory cell pair 430 may store an opposite logic state (e.g., a 1). In some examples, storing states in two memory cells of a memory cell pair to store a single bit of information may be an example of differential storage or differential signaling. In differential storage, the states stored on the two memory cells of the memory cell pair may be configured to reduce a likelihood of experiencing errors in the single bit of information.

In the example of the memory array 470, each memory cell 405 in a memory cell pair 430 may be coupled with a same word line 410. For example, both memory cells 405 in the memory cell pair 430 may be coupled with the word line WL_M. Additionally, each memory cell 405 in a memory cell pair 430 may include a first memory cell 405 coupled with one digit line 415 and a second memory cell 405 coupled with another digit line 415. For example, one memory cell 405 in the memory cell pair 430 may be coupled with the digit line DL_2 and another memory cell 405 in the memory cell pair 430 may be coupled with another digit line DL_3. In some cases, the digit lines 415 may be coupled with the memory cells 405 in each memory cell pair 430 may be adjacent (e.g., next to one another, neighboring digit lines 415). Additionally, or alternatively, the memory cells 405 in each memory cell pair 430 may be separated by one, two, or more digit lines 415. For example, each memory cell pair 430 may include memory cells 405 separated by one digit line 415 (e.g., a memory cell pair 430 may include a first memory cell 405 coupled with the digit line DL_0 and a second memory cell coupled with the digit line DL_2).

In some cases, the memory cells 405 in each memory cell pair 430 being coupled with a same word line 410 may decrease differences (e.g., charge drift, threshold drift, access differences, voltage characteristics) between the memory cells 405 in each memory cell pair 430 (e.g., as compared to memory cells 405 in a memory cell pair 430 that are each coupled with different word lines 410). Additionally, the memory cells 405 in each memory cell pair 430 being coupled with adjacent digit lines 415 may decrease differences (e.g., charge drift, threshold drift, access differences, voltage characteristics) between the memory cells 405 in each memory cell pair 430 (e.g., as compared to memory cells 405 in a memory cell pair 430 that are each coupled with digit lines 415 that are separated by more physical distance).

In some cases, the memory cells 405 in each memory cell pair 430 may be coupled with different plate lines 420. For example, each of the plate lines 420 (e.g., PL_0, PL_1, PL_2, PL_3, and PL_M) may be isolated from one another. Additionally, or alternatively, subsets of the plate lines 420 may be contiguous. That is, a single contiguous layer of conductive material may correspond to more than one plate line 420 (e.g., more than one adjacent plate lines 420). For example, the plate lines PL_2 and PL_3 may correspond to a single plate line 420 (e.g., comprising a single contiguous conductive material). In some examples, the memory cells 405 in each memory cell pair 430 may be coupled with a same plate line 420. In some cases, the memory cells 405 in each memory cell pair 430 being coupled with a same plate line 420 may decrease differences (e.g., charge drift, threshold drift, access differences, voltage characteristics) between the memory cells 405 in each memory cell pair 430 (e.g., as compared to memory cells 405 in a memory cell pair 430 that are each coupled with different plate lines 420).

The memory array 470 may be coupled with a set of sense amplifiers 450. For example, the memory array configuration 400 may include sense amplifiers 450 each coupled with two digit lines 415. That is, each sense amplifier 450 may be coupled with a first digit line 415 associated with a first set of memory cells 405 and a second (e.g., different) digit line 415 associated with a second set of memory cells 405. Here, each sense amplifier 450 may be configured to detect single bits of information 425 stored by memory cell pairs 430 each including one memory cell 405 from the first set of memory cells 405 (e.g., coupled with the first digit line 415) and another memory cell 405 from the second set of memory cells 405 (e.g., coupled with the second digit line 415). For example, the sense amplifier 450 may be coupled with a first set of memory cells 405 via a first digit line 415 (e.g., digit line DL_2) and coupled with a second set of memory cells 405 via second digit line 415 (e.g., digit line DL_3).

In some cases, each memory cell pair 430 may correspond to a single address. For example, one address may indicate the memory cell pair 430 including two memory cells 405. Here, the memory device may receive access commands (e.g., write commands, read commands) indicating a single address that corresponds to the memory cell pair 430 (e.g., including two memory cells 405). To access a memory cell pair 430, the memory device may activate (e.g., by applying a voltage to) the word line 410 coupled with both memory cells 405 in the memory cell pair 430, both digit lines 415 each coupled with one of the memory cells 405 in the memory cell pair 430, and the one or more plate lines 420 coupled with each of the memory cells 405 in the memory cell pair 430. In some cases, a digit line driver may be coupled with both digit lines 415 (e.g., associated with the single address), and a plate line driver may be coupled with both plate lines 420 (e.g., associated with the single address). Here, to access a memory cell pair associated with the single address, the digit line driver and plate line driver may activate the corresponding digit lines 415 and plate lines 420, respectively.

To determine a logic state of a single bit of information 425 stored by a memory cell pair 430, a first memory cell 405 in the memory cell pair 430 may transfer a first charge to a first digit line 415 and a second memory cell 405 in the memory cell pair 430 may transfer a second charge to a second digit line 415. Then, the sense amplifier 450 may detect the single bit of information 425 stored by the memory cell pairs 430 based on a difference between a voltage (e.g., charge) on the first digit line 415 and the second digit line 415. For example, the sense amplifier 450 may determine that the single bit of information 425 is a first logic state in cases that a voltage on the first digit line 415 is greater than a voltage on the second digit line. Additionally, or alternatively, the sense amplifier 450 may determine that the single bit of information 425 is a second logic state in cases that the voltage on the first digit line 415 is less than the voltage on the second digit line 415.

Figure 5:
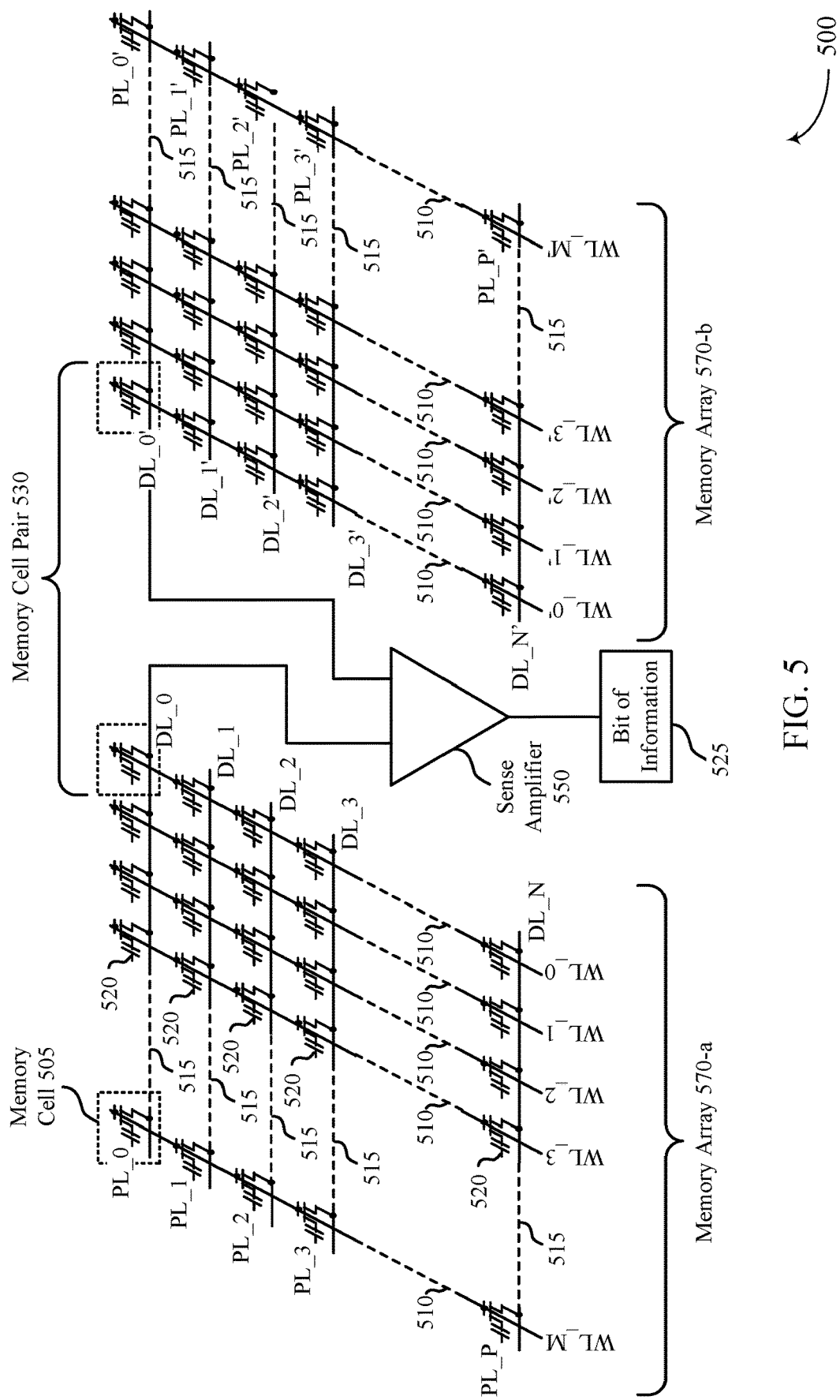

FIG. 5 illustrates an example of a memory array configuration 500 that supports differential storage in memory arrays in accordance with examples as disclosed herein. The memory array configuration 500 may include aspects of the systems, memory dies, and hysteresis curves as described with reference to FIGS. 1 through 3. For example, the memory arrays 570, memory cell 505, word lines 510, digit lines 515, and plate lines 520 may be examples of memory arrays, memory cells, word lines, digit lines, and plate lines, respectively, as described with reference to FIGS. 1 through 3. The memory array configuration 500 may additionally include memory cell pairs 530, which may be programmed and sensed as described with reference to FIGS. 3A and 3B. The memory array configuration 500 may additionally include a sense amplifier 550, which may be an example of sense amplifiers and sense components as described with reference to FIGS. 1 through 3.

The memory arrays 570 may be included on a memory die (e.g., as described with reference to FIGS. 1 and 2). Additionally, or alternatively, the memory arrays 570 may be part of a 2D memory array 570 or the memory arrays 570 may be a portion of a 3D memory array. In cases that the memory arrays 570 are part of a 3D memory array, the memory array configuration 500 may be positioned above or below one or more similar memory array configurations. That is, the memory array configuration 500 may be positioned on a first level (e.g., deck) of the memory array and one or more additionally memory array configurations 500 may be positioned on other levels (e.g., decks).

The memory array configuration 500 may include memory cells 505 positioned at intersections of the word lines 510 and the digit lines 515 and the plate lines 520. In some cases, each memory cell 505 may include a capacitor and a switching component (e.g., as described with reference to FIG. 2). Additionally, each memory cell 505 may be a part of a memory cell pair 530. That is, each memory cell 505 may, in conjunction with another memory cell 505 that is a part of a same memory cell pair 530, store a single bit of information 525. For example, if a first memory cell 505 in the memory cell pair 530 stores one logic state (e.g., a 0), the second memory cell 505 in the memory cell pair 530 may store an opposite logic state (e.g., a 1).

The memory array configuration 500 may include multiple memory arrays 570 positioned on a same level (e.g., on a same level with respect to a y-axis, on a same vertical level). For example, the memory array configuration 500 may include a first memory array 570-a that is adjacent (e.g., next to, adjoined) to a second memory array 570-b. Additionally, each memory cell pair 530 may include a first memory cell 505 from the memory array 570-a and a second memory cell 505 from the memory array 570-b. In some cases, the memory cells 505 in each memory cell pair 530 being on a same level may decrease differences (e.g., charge drift, threshold drift, access differences, voltage characteristics) between the memory cells 505 in each memory cell pair 530 (e.g., as compared to memory cells 505 in a memory cell pair 530 that are on different levels of a 3D memory array).

The memory cells 505 in each memory cell pair 530 may include a first memory cell 505 coupled with one digit line 515 and a second memory cell 505 coupled with another digit line 515 (e.g., a first digit line 515 in the memory array 570-a and a second digit line 515 in the memory array 570-b). For example, one memory cell 505 in the memory cell pair 530 may be coupled with the digit line DL_0 and another memory cell 505 in the memory cell pair 530 may be coupled with another digit line DL_0'. Additionally, the memory cells 505 in each memory cell pair 530 may be coupled with different word lines 510 (e.g., a first word line 510 in the memory array 570-a and a second word line 510 in the memory array 570-b). For example, the memory cell 505 in the memory cell pair 530 in the may be coupled with the word line WL_0 (e.g., in the memory array 570-a) and another memory cell 505 in the memory cell pair 530 may be coupled with another word line WL_0' (e.g., in the memory array 570-b). In some cases, the memory cells 505 in each memory cell pair 530 may be coupled with different plate lines 520.

The memory array 570 may be coupled with a set of sense amplifiers 550. For example, the memory array configuration 500 may include sense amplifiers 550 each coupled with two digit lines 515. That is, each sense amplifier 550 may be coupled with a first digit line 515 associated with a first set of memory cells 505 in one memory array 570-a and a second (e.g., different) digit line 515 associated with a second set of memory cells 505 in another memory array 570-b. Here, each sense amplifier 550 may be configured to detect single bits of information 525 stored by memory cell pairs 530 each including one memory cell 505 from the first set of memory cells 505 (e.g., coupled with the first digit line 515 in the memory array 570-*a*) and another memory cell 505 from the second set of memory cells 505 (e.g., coupled with the second digit line 515 in the memory array 570-*b*). For example, the sense amplifier 550 may be coupled with a first set of memory cells 505 in the memory array 570-*a* via a first digit line 515 (e.g., digit line DL_0) and coupled with a second set of memory cells 505 in the memory array 570-*b* via second digit line 515 (e.g., digit line DL_0').

In some cases, the memory cells 505 in each memory cell pair 530 may be separated from the sense amplifier 550 by equivalent distances (e.g., physical distances, electrical distances). For example, the memory cells 505 in each memory cell pair 530 may be separated from the sense amplifier 550 by a same quantity of word lines 510. That is, both memory cells 505 in the memory cell pair 530 may be coupled with the word line 510 (e.g., word lines WL_0 and WL_0') that is closest to the sense amplifier 550 (e.g., separated from the sense amplifier 550 by no word lines 510). In another example, another memory cell pair 530 may include a first memory cell 505 from the memory array 570-*a* coupled with the word line WL_2 and a second memory cell 505 from the memory array 570-*b* coupled with the word line WL_2'. Here, both memory cells 505 in the memory cell pair 530 may be separated from the sense amplifier 550 by two word lines 510 (e.g., by word lines WL_0 and WL_1 in the memory array 570-*a* and word lines WL_0' and WL_1' in the memory array 570-*b*). In some cases, the memory cells 505 in each memory cell pair 530 being separated from the sense amplifier 550 by equivalent distances (such as similar electrical distances) may decrease differences (e.g., charge drift, threshold drift, access differences, voltage characteristics) between the memory cells 505 in each memory cell pair 530 (e.g., as compared to memory cells 505 in a memory cell pair 530 that are separated from the sense amplifier 550 by different electrical distances). The term electrical distance may refer to differences of electrical conditions that a first signal may experience over a first conductive path as compared with electrical conditions that a second signal may experience over a second conductive path. Signals with similar electrical distances may experience similar electrical conditions over their respective paths.

In some cases, each memory cell pair 530 may correspond to a single address. For example, one address may indicate the memory cell pair 530 including two memory cells 505. Here, the memory device may receive access commands (e.g., write commands, read commands) indicating a single address that corresponds to the memory cell pair 530 including two memory cells 505. Here, each address may correspond to two word lines 510, two digit lines 515, and two plate lines 520. To access a memory cell pair 530, the memory device may activate (e.g., by applying a voltage to) both word lines 510 each coupled with one of the memory cells 505 in the memory cell pair 530, both digit lines 515 each coupled with one of the memory cells 505 in the memory cell pair 530, and both plate lines 520 each coupled with one of the memory cells 505 in the memory cell pair 530. In some cases, a word line driver may be coupled with both word lines 510 (e.g., associated with the single address), a digit line driver may be coupled with both digit lines 515 (e.g., associated with the single address), and a plate line driver may be coupled with both plate lines 520 (e.g., associated with the single address). Here, to access a memory cell pair associated with the single address, the word line driver, digit line driver, and plate line driver may activate the corresponding word lines 510, digit lines 515, and plate lines 520, respectively.

To determine a logic state of a single bit of information 525 stored by a memory cell pair 530, a first memory cell 505 in the memory cell pair 530 may transfer a first charge to a first digit line 515 in the memory array 570-*a* and a second memory cell 505 in the memory cell pair 530 may transfer a second charge to a second digit line 515 in the memory array 570-*b*. Then, the sense amplifier 550 may detect the single bit of information 525 stored by the memory cell pairs 530 based on a difference between a voltage (e.g., charge) on the first digit line 515 and the second digit line 515. For example, the sense amplifier 550 may determine that the single bit of information 525 is a first logic state in cases that a voltage on the first digit line 515 is greater than a voltage on the second digit line. Additionally, or alternatively, the sense amplifier 550 may determine that the single bit of information 525 is a second logic state in cases that the voltage on the first digit line 515 is less than the voltage on the second digit line 515.

Figure 6:
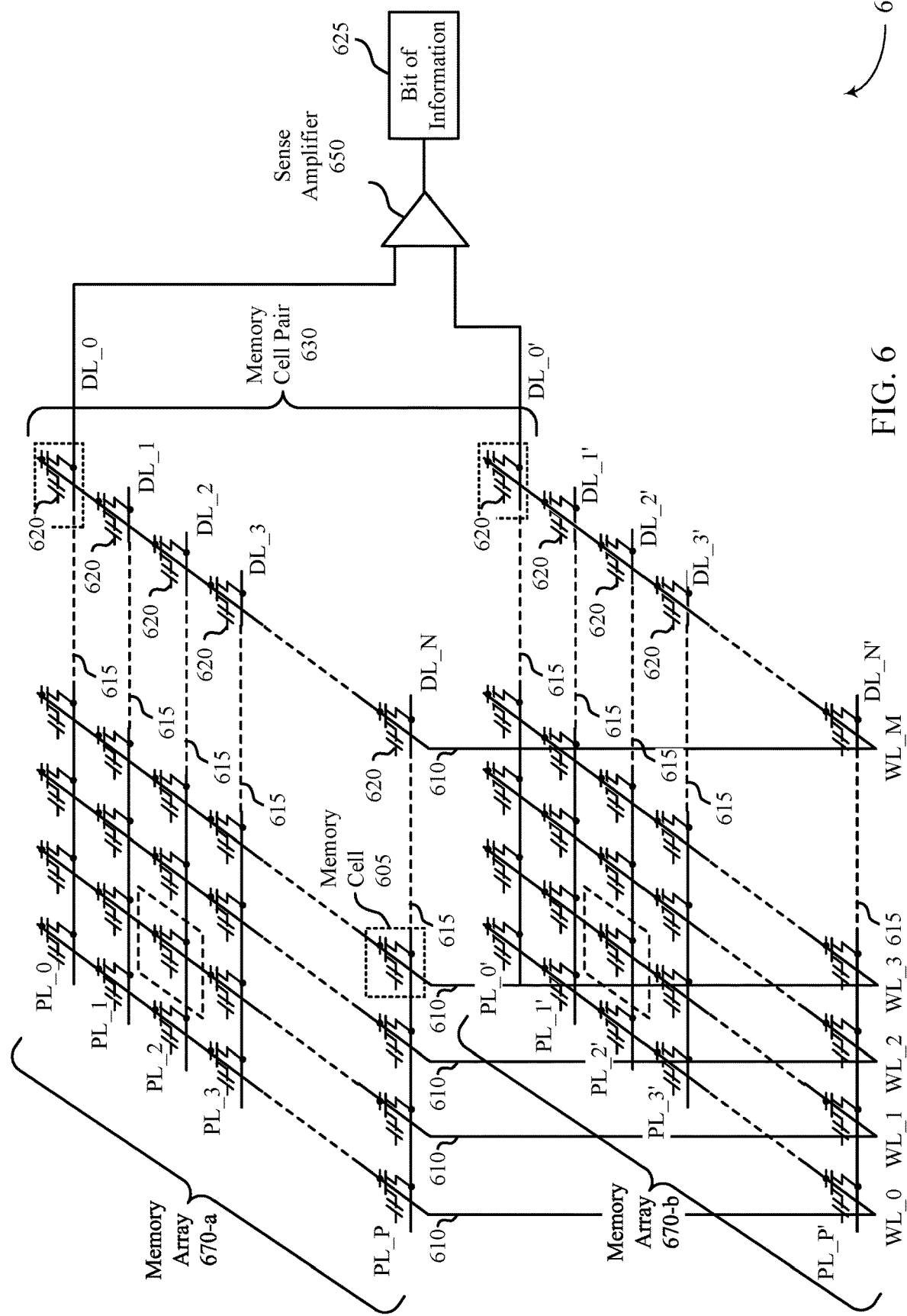

FIG. 6 illustrates an example of a memory array configuration 600 that supports differential storage in memory arrays in accordance with examples as disclosed herein. The memory array configuration 500 may include aspects of the systems, memory dies, and hysteresis curves as described with reference to FIGS. 1 through 3. For example, the memory arrays 670, memory cell 605, word lines 610, digit lines 615, and plate lines 620 may be examples of memory arrays, memory cells, word lines, digit lines, and plate lines, respectively, as described with reference to FIGS. 1 through 3. The memory array configuration 600 may additionally include memory cell pairs 630, which may be programmed and sensed as described with reference to FIGS. 3A and 3B. The memory array configuration 600 may additionally include a sense amplifier 650, which may be an example of sense amplifiers and sense components as described with reference to FIGS. 1 through 3.

The memory array configuration 600 may include memory cells 605 positioned at intersections of the word lines 610 and the digit lines 615 and the plate lines 620. In some cases, each memory cell 605 may include a capacitor and a switching component (e.g., as described with reference to FIG. 2). Additionally, each memory cell 605 may be a part of a memory cell pair 630. That is, each memory cell 605 may, in conjunction with another memory cell 605 that is a part of a same memory cell pair 630, store a single bit of information 625. For example, if a first memory cell 605 in the memory cell pair 630 stores one logic state (e.g., a 0), the second memory cell 605 in the memory cell pair 630 may store an opposite logic state (e.g., a 1).

The memory array configuration 600 may include multiple memory arrays 670 positioned on different levels (e.g., on a different levels with respect to a y-axis, on different decks). For example, the memory array configuration 600 may include a first memory array 670-*a* that is positioned over a second memory array 670-*b* (e.g., with respect to a substrate). Additionally, each memory cell pair 630 may include a first memory cell 605 from the memory array 670-*a* and a second memory cell 605 from the memory array 670-*b*.

The memory cells 605 in each memory cell pair 630 may be coupled a same word line 610 (e.g., that is coupled with memory cells 605 in the memory array 670-*a* and the memory array 670-*b*). For example, the memory cell pair 630 may include a memory cell 605 in the memory array 670-*a* and a memory cell 605 in the memory array 670-*b* that are each coupled with the word line WL_M. In some cases, the memory cells 605 in each memory cell pair 630 being coupled with a same word line 610 may decrease differences (e.g., charge drift, threshold drift, access differences, voltage characteristics) between the memory cells 605 in each memory cell pair 630 (e.g., as compared to memory cells 605 in a memory cell pair 630 that are coupled with different word lines 610).

Additionally, the memory cells 605 in each memory cell pair 630 may include a first memory cell 605 coupled with one digit line 615 and a second memory cell 605 coupled with another digit line 615 (e.g., a first digit line 615 in the memory array 670-a and a second digit line 615 in the memory array 670-b). For example, one memory cell 605 in the memory cell pair 630 may be coupled with the digit line DL_0 and another memory cell 605 in the memory cell pair 630 may be coupled with another digit line DL_0'. Additionally, the memory cells 605 in each memory cell pair 630 may be coupled with different plate lines 620. For example, one memory cell 605 in the memory cell pair 630 may be coupled with the plate line PL_0 and another memory cell 605 in the memory cell pair 630 may be coupled with another plate line PL_0'.

The memory cells 605 in each memory cell pair 630 may be positioned above one another. That is, the memory cells 605 in each memory cell pair 630 may be coupled with digit lines 615 that are positioned similarly with respect to a substrate (e.g., the digit line 615 coupled with one memory cell 605 in a memory cell pair 630 in the memory array 670-a may be positioned above the digit line 615 coupled with another memory cell 605 in the memory cell pair 630 in the memory array 670-b). Additionally, the memory cells 605 in each memory cell pair 630 may be coupled with plate lines 620 that are positioned similarly with respect to a substrate (e.g., the plate line 620 coupled with one memory cell 605 in a memory cell pair 630 in the memory array 670-a may be positioned above the plate line 620 coupled with another memory cell 605 in the memory cell pair 630 in the memory array 670-b). In some cases, the memory cells 605 in each memory cell pair 630 being positioned above one another decrease differences (e.g., charge drift, threshold drift, access differences, voltage characteristics) between the memory cells 605 in each memory cell pair 630 (e.g., as compared to memory cells 605 in a memory cell pair 630 that are not positioned above one another).

The memory array 670 may be coupled with a set of sense amplifiers 650. For example, the memory array configuration 600 may include sense amplifiers 650 each coupled with two digit lines 615. That is, each sense amplifier 650 may be coupled with a first digit line 615 associated with a first set of memory cells 605 in one memory array 670-a and a second (e.g., different) digit line 615 associated with a second set of memory cells 605 in another memory array 670-b. Here, each sense amplifier 650 may be configured to detect single bits of information 625 stored by memory cell pairs 630 each including one memory cell 605 from the first set of memory cells 605 (e.g., coupled with the first digit line 615 in the memory array 670-a) and another memory cell 605 from the second set of memory cells 605 (e.g., coupled with the second digit line 615 in the memory array 670-b). For example, the sense amplifier 650 may be coupled with a first set of memory cells 605 in the memory array 670-a via a first digit line 615 (e.g., digit line DL_0) and coupled with a second set of memory cells 605 in the memory array 670-b via second digit line 615 (e.g., digit line DL_0').

In some cases, each memory cell pair 630 may correspond to a single address. For example, one address may indicate the memory cell pair 630 including two memory cells 605. Here, the memory device may receive access commands (e.g., write commands, read commands) indicating a single address that corresponds to the memory cell pair 630 including two memory cells 605. Here, each address may correspond to one word line 610, two digit lines 615, and two plate lines 620. To access a memory cell pair 630, the memory device may activate (e.g., by applying a voltage to) the word line 610 coupled with both of the memory cells 605 in the memory cell pair 630, both digit lines 615 each coupled with one of the memory cells 605 in the memory cell pair 630, and both plate lines 620 each coupled with one of the memory cells 605 in the memory cell pair 630. In some cases, a digit line driver may be coupled with both digit lines 615 (e.g., associated with the single address), and a plate line driver may be coupled with both plate lines 620 (e.g., associated with the single address). Here, to access a memory cell pair associated with the single address, the digit line driver and plate line driver may activate the corresponding digit lines 615 and plate lines 620, respectively.

To determine a logic state of a single bit of information 625 stored by a memory cell pair 630, a first memory cell 605 in the memory cell pair 630 may transfer a first charge to a first digit line 615 in the memory array 670-a and a second memory cell 605 in the memory cell pair 630 may transfer a second charge to a second digit line 615 in the memory array 670-b. Then, the sense amplifier 650 may detect the single bit of information 625 stored by the memory cell pairs 630 based on a difference between a voltage (e.g., charge) on the first digit line 615 and the second digit line 615. For example, the sense amplifier 650 may determine that the single bit of information 625 is a first logic state in cases that a voltage on the first digit line 615 is greater than a voltage on the second digit line. Additionally, or alternatively, the sense amplifier 650 may determine that the single bit of information 625 is a second logic state in cases that the voltage on the first digit line 615 is less than the voltage on the second digit line 615.

Figure 7:
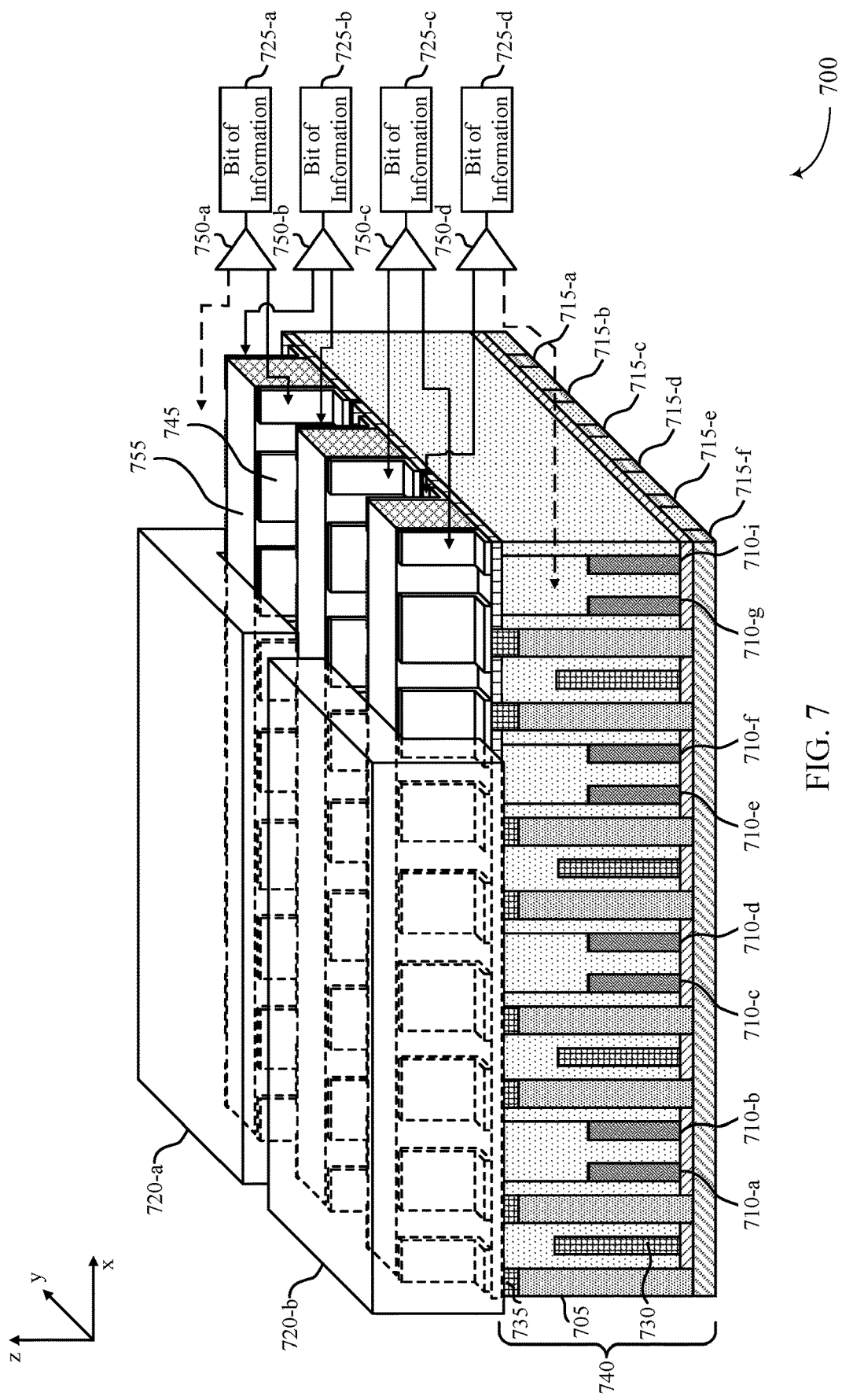
FIGS. 7 and 8 illustrate examples of memory dies that support differential storage in memory arrays in accordance with examples as disclosed herein.

FIG. 7 illustrates an example of a memory die 700 that supports differential storage in memory arrays in accordance with examples as disclosed herein. The memory die 700 may include aspects of the systems, memory dies, hysteresis curves, and memory array configurations as described with reference to FIGS. 1 through 6. For example, the word lines 710, digit lines 715, and plate lines 720 may be examples of word lines, digit lines, and plate lines, respectively, as described with reference to FIGS. 1 through 6. The memory die 700 may additionally include memory cell pairs, which may be programmed and sensed as described with reference to FIGS. 3A and 3B. The memory die 700 may additionally include sense amplifiers 750, which may be an example of sense amplifiers and sense components as described with reference to FIGS. 1 through 6.

The memory die 700 may include a set of memory cells formed along dielectric walls 755 (e.g., including a dielectric material) extending in the x-direction. In some cases, the dielectric walls 755 may be positioned above (e.g., in the z-direction) and between rows of contacts 735. Each memory cell may include an electrode segment 745 (e.g., a bottom electrode). In some cases, an electrode segment 745 may include a sidewall formed on and in contact with a sidewall of a dielectric wall 755 and a lower surface (e.g., perpendicular to the sidewall) formed on and in contact with a substrate 740. The memory die 700 may include a set of plate lines 720 extending in the x-direction over rows of electrode segments 745. A plate line 720 may be configured as an upper electrode for the electrode segments 745, which may form a set of capacitors corresponding to the memory cells. In some cases, the memory die 700 may include a layer of ferroelectric material between the electrode segments 745 and the plate line 720. That is, the ferroelectric material may conformally line surfaces of the electrode segments 745 and the dielectric walls 755. Each memory cell may be programmed to store one or more logic states by applying a voltage across a selected electrode segment 745 and a plate line 720, which may store charge (e.g., a polarization state, a dielectric charge) across the ferroelectric material.

In some cases, a memory die 700 may include a contiguous layer of a conductive material corresponding to a single plate line 720 over each of the rows of electrode segments 745 on the memory die 700. Here, the plate line 720 may be associated with a relatively large capacitance, which may increase a latency associated with accessing memory cells on the memory die 700. In the example of the memory die 700, the layer of the conductive material corresponding to the plate lines 720 may not be contiguous over the memory die 700. In some cases, the plate line 720-*a* include one portion of conductive material that is distinct from (e.g., noncontiguous from) another portion of the conductive material corresponding to the plate line 720-*b*. In some cases, the memory die 700 may additionally include a dielectric material coupled with the plate lines 720-*a* and 720-*b* (e.g., acting as a barrier between the plate lines 720-*a* and 720-*b* to isolate the plate line 720-*a* from the plate line 720-*b*). Thus, the memory die 700 may include plate lines 720 that are coupled with less than each of the rows of electrode segments 745 on the memory die 700. For example, each plate line 720 may be coupled with four, eight, or sixteen rows of electrode segments 745 (e.g., each associated with a digit line 715). In some cases, decreasing a size of each plate line 720 may decrease a capacitance of the plate lines 720, which may result in a decreased latency of the memory die 700.

The memory die 700 illustrates plate lines 720 that are orthogonal to the word lines 710 (e.g., and parallel to the digit lines 715). In some other examples, the plate lines 720 may instead be parallel to the word lines 710 (e.g., and orthogonal to the digit lines 715). Here, each plate line 720 may be coupled with less than each of the word lines 710 (e.g., via the transistors 705 and electrode segments 745) and may similarly result in a decreased plate capacitance and decreased latency.

In some examples, forming the memory die 700 may include a forming at least a portion of an electrode on a sidewall (e.g., according to a C1S architecture). That is, some examples of memory dies may be formed based on forming a vertical stud (e.g., a vertical columns positioned above a substrate) or based on forming a well. Alternatively, the memory die 700 may be formed based on forming at least a portion of an electrode on a sidewall (e.g., the electrode segments 745 are formed at least partially on the sidewalls of the dielectric walls 755). Additionally, to form the memory die 700, after depositing a contiguous layer of conductive material over the rows of electrode segments 745 that corresponds to the plate lines 720, a manufacturing process of the memory die 700 may additionally include patterning (e.g., selectively etching) portions of the conductive material to form more than one plate line 720. In some cases, patterning portions of the conductive material to form the multiple plate lines 720 may additionally include patterning the ferroelectric material (e.g., coupling the plate lines 720 with the electrode segments 745). Thus, the memory die 700 may include multiple plate lines 720 and multiple portions of distinct (e.g., noncontiguous) ferroelectric material. After patterning the plate lines 720, a dielectric material may be deposited over the conductive material forming the plate lines 720 (e.g., and between the plate lines 720).

The memory die 700 may further include the substrate 740 to support access operations for memory cells positioned on the substrate 740. The substrate 740 may include a set of digit lines 715 extending in the x-direction and a set of word lines 710 extending in the 7-direction and configured to selectively couple a set of memory cells with a set of digit lines 715. The substrate 740 may further include a set of transistors 705 arranged in one or more rows extending in the x-direction and one or more columns extending in the y-direction. A transistor 705 may be operable to selectively couple an electrode segment 745 with a digit line 715. For example, a word line 710 may be configured to bias a gate of the transistor 705 to couple a source terminal and a drain terminal of the transistors 705. In some cases, each transistor 705 may include a contact 735 (e.g., a terminal, such as the source terminal or drain terminal) arranged on an upper surface of the substrate 740, where each electrode segment 745 may be positioned above and in contact with one of the contacts 735. Here, each contact 735 may be in electronic communication with one of the word lines 710 and one of the digit lines 715 (e.g., the word line 710 and the digit line 715 that are configured to bias the gate of the transistor 705 including the contact 735). In some cases, the substrate 740 may include a set of shield lines 730 (e.g., barrier lines) extending in the y-direction arranged between alternating columns of transistors 705. A shield line 730 may act as barrier between pairs of columns of transistors 705, which may mitigate undesirable effects on a first word line 710 if an adjacent second word line 710 is biased, such as a voltage of the second word line 710 activating a transistor 705 coupled with the first word line 710.

The memory cells on the memory die 700 may each be a part of a memory cell pair. That is, each memory cell may, in conjunction with another memory cell that is a part of a same memory cell pair, store a single bit of information 725. For example, if a first memory cell in a memory cell pair stores one logic state (e.g., a 0), the second memory cell in the memory cell pair may store an opposite logic state (e.g., a 1). In the example of the memory die 700, the memory cells in each memory cell pair may be included on the same level and within a single memory array (e.g., as described with reference to FIG. 4). That is, each word line 710 may be coupled with a set of memory cell pairs (e.g., including both memory cells in each memory cell pair).

Additionally, each memory cell in a memory cell pair may include a first memory cell coupled with one digit line 715 and a second memory cell coupled with another digit line 715. In the example of the memory die 700, the memory cells in each memory cell pair may be separated by one digit line 715. For example, the digit line 715-*a* may be coupled with a first set of memory cells and the digit line 715-*c* may be coupled with a second set of memory cells. Additionally, the memory die 700 may include memory cell pairs with one memory cell from the first set (e.g., coupled with the digit line 715-*a*) and another memory cell from the second set (e.g., coupled with the digit line 715-*c*). Here, each memory cell pair may be separated by the digit line 715-*b*. In the example of the memory die 700, the memory cells in each memory cell pair may be formed along a same side of the dielectric walls 755. That is, the memory cells in each memory cell pair may each include an electrode segment 745 (e.g., a bottom electrode) with a sidewall formed on and in contact with a sidewall of the dielectric wall 755 that is facing a same direction. In some cases, the memory cells in each memory cell pair being coupled with sidewalls of the dielectric walls 755 that are facing a same direction may decrease differences (e.g., charge drift, threshold drift, access differences, voltage characteristics) between the memory cells in each memory cell pair (e.g., as compared to memory cells in a memory cell pair that are each coupled sidewalls of the dielectric walls 755 that face different directions).

Each memory cell in a memory cell pair may additionally be coupled with a same plate line 720 (e.g., via a ferroelectric material). For example, the plate line 720-a may be coupled with electrode segments 745 (e.g., via the ferroelectric material) in a first row (e.g., positioned above the digit line 715-a) and with electrode segments 745 in a second row (e.g., positioned above the digit line 715-c). That is, the plate line 720-a may be in contact with the ferroelectric material, and the ferroelectric material may be positioned between the plate line 720-a and the electrode segments 745 in the first row and the electrode segments 745 in the second row. Here, the memory die 700 may include memory cell pairs including a first memory cell coupled with the digit line 715-a and a second memory cell coupled with the digit line 715-c. In some cases, each memory cell in a pair being coupled with a same plate line 720 may decrease differences (e.g., charge drift, threshold drift, access differences, voltage characteristics) between the memory cells in each memory cell pair (e.g., as compared to memory cells in a memory cell pair that are each coupled with different plate lines 720).

The memory die 700 may include a set of sense amplifiers 750. Additionally, each of the sense amplifiers 750 may be coupled with two digit lines 715. That is, each sense amplifier 750 may be coupled with a first digit line 715 associated with a first set of memory cells and a second (e.g., different) digit line 715 associated with a second set of memory cells. Here, each sense amplifier 750 may be configured to detect single bits of information 725 stored by memory cell pairs each including one memory cell from the first set of memory cells (e.g., coupled with the first digit line 715) and another memory cell from the second set of memory cells (e.g., coupled with the second digit line 715). For example, the sense amplifier 750-c may be coupled with a first set of memory cells via the digit line 715-d and coupled with a second set of memory cells via second digit line 715-f. Here, the sense amplifier 750-c may detect single bits of information 725-c stored by memory cell pairs including a memory cell coupled with the digit line 715-d and a memory cell coupled with the digit line 715-f.

Figure 8:
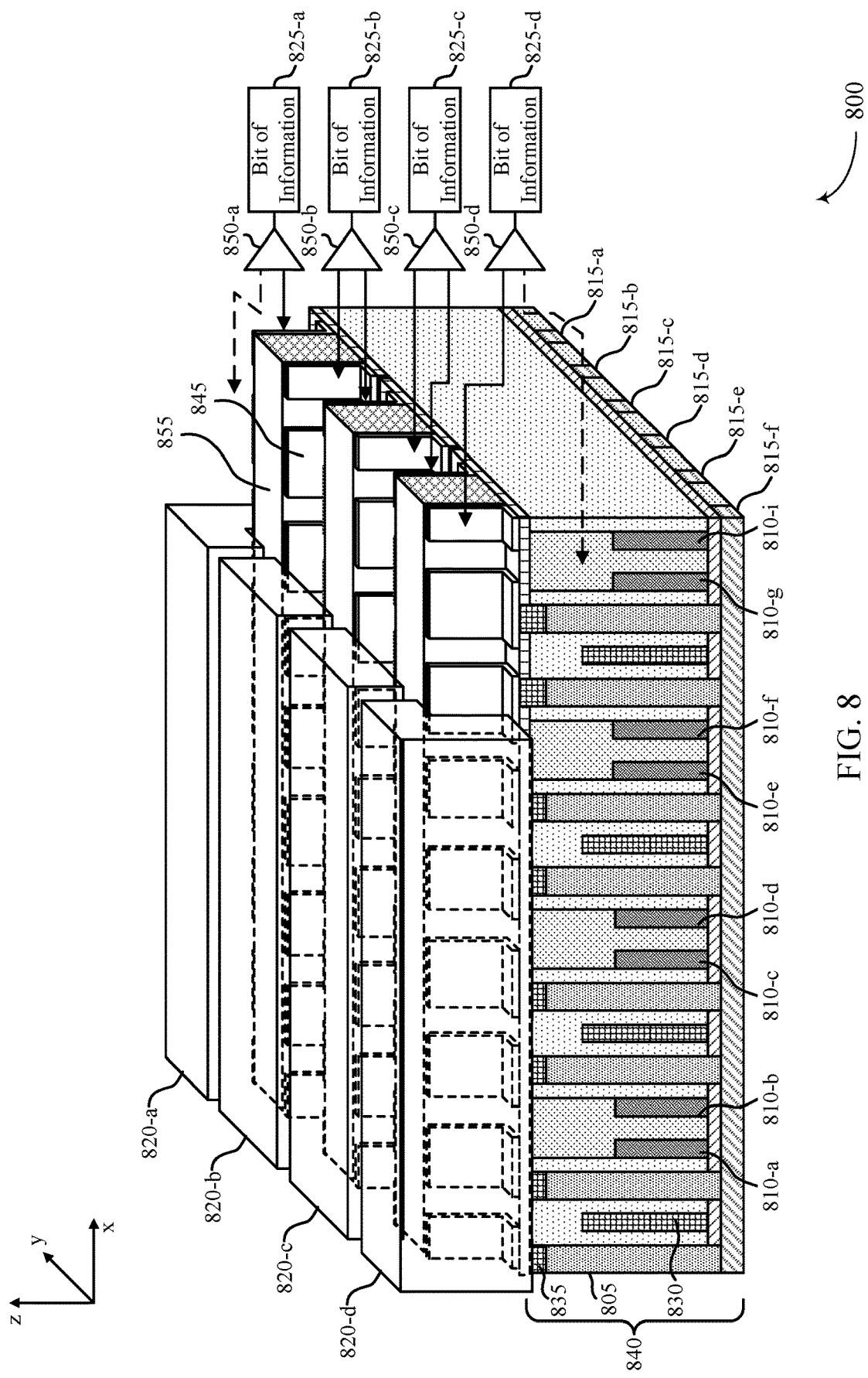

FIG. 8 illustrates an example of a memory die 800 that supports differential storage in memory arrays in accordance with examples as disclosed herein. The memory die 800 may include aspects of the systems, memory dies, hysteresis curves, and memory array configurations as described with reference to FIGS. 1 through 7. For example, the word lines 810, digit lines 815, and plate lines 820 may be examples of word lines, digit lines, and plate lines, respectively, as described with reference to FIGS. 1 through 7. The memory die 800 may additionally include memory cell pairs, which may be programmed and sensed as described with reference to FIGS. 3A and 3B. The memory die 800 may additionally include sense amplifiers 850, which may be an example of sense amplifiers and sense components as described with reference to FIGS. 1 through 7.

The memory die 800 may include a set of memory cells formed along dielectric walls 855 (e.g., including a dielectric material) extending in the x-direction. In some cases, the dielectric walls 855 may be positioned above (e.g., in the z-direction) and between rows of contacts 835. Each memory cell may include an electrode segment 845 (e.g., a bottom electrode). In some cases, an electrode segment 845 may include a sidewall formed on and in contact with a sidewall of a dielectric wall 855 and a lower surface (e.g., perpendicular to the sidewall) formed on and in contact with a substrate 840. The memory die 800 may include a set of plate lines 820 extending in the x-direction over rows of electrode segments 845. The plate lines 820 may be configured as an upper electrode for the electrode segments 845, which may form a set of capacitors corresponding to the memory cells. In some cases, the memory die 800 may include a layer of ferroelectric material between the electrode segments 845 and the plate line 820. That is, the ferroelectric material may conformally line surfaces of the electrode segments 845 and the dielectric walls 855. Each memory cell may be programmed to store one or more logic states by applying a voltage across a selected electrode segment 845 and a plate line 820, which may store charge (e.g., a polarization state, a dielectric charge) across the ferroelectric material.

In the example of the memory die 800, the layer of the conductive material corresponding to the plate lines 820 may not be contiguous over the memory die 800. That is, the memory die 800 may include plate lines 820 (e.g., portions of the conductive material) that are each positioned above and electrically coupled with two rows of electrode segments 845. For example, each plate line 820 may be coupled with one row of electrode segments 845 coupled with a first dielectric wall 855 (e.g., and extending above one digit line 815) and a second row of electrode segments 845 coupled with a second dielectric wall 855 (e.g., and extending above another digit line 815 adjacent to the first digit line 815). In one example, the plate line 820-b may be coupled with the row of electrode segments 845 that are coupled with the digit line 815-b and the row of electrode segments 845 that are coupled with the digit line 815-c (e.g., adjacent to the digit line 815-b). Here, the rows of electrode segments 845 (e.g., coupled with the digit lines 815-b and 815-c) may be coupled with the plate line 820-b via a contiguous portion of ferroelectric material. That is, the plate line 820-b may be in contact with the ferroelectric, and the ferroelectric material may be positioned between the plate line 820-b and the rows of the electrode segments 845 positioned above the digit lines 815-b and 815-c.

The memory die 800 illustrates plate lines 820 that are orthogonal to the word lines 810 (e.g., and parallel to the digit lines 815). In some other examples, the plate lines 820 may instead be parallel to the word lines 810 (e.g., and orthogonal to the digit lines 815). Here, each plate line 820 may be coupled with less than each of the word lines 810 (e.g., via the transistors 805 and electrode segments 845) and may similarly result in a decreased plate capacitance and decreased latency.

In some examples, forming the memory die 800 may include a forming at least a portion of an electrode on a sidewall (e.g., according to a C1S architecture). That is, some examples of memory dies may be formed based on forming a vertical stud (e.g., a vertical columns positioned above a substrate) or based on forming a well. Alternatively, the memory die 800 may be formed based on forming at least a portion of an electrode on a sidewall (e.g., the electrode segments 845 are formed at least partially on the sidewalls of the dielectric wall 855). Additionally, to form the memory die 800, after depositing a contiguous layer of conductive material over the rows of electrode segments 845 that corresponds to the plate lines 820, a manufacturing process of the memory die 800 may additionally include patterning (e.g., selectively etching) portions of the conductive material to form more than one plate line 820. In some cases, patterning portions of the conductive material to form the multiple plate lines 820 may additionally include patterning the ferroelectric material (e.g., coupling the plate lines 820 with the electrode segments 845). Thus, the memory die 800 may include multiple plate lines 820 and multiple portions of distinct (e.g., noncontiguous) ferroelectric material. After patterning the plate lines 820, a dielectric material may be deposited over the conductive material forming the plate lines 820 (e.g., and between the plate lines 820). Thus, the memory die 800 may additionally include a dielectric material acting as a barrier between the plate lines 820 to isolate the plate lines 820 from other plate lines 820.

The memory die 800 may further include the substrate 840 to support access operations for memory cells positioned on the substrate 840. The substrate 840 may include a set of digit lines 815 extending in the x-direction and a set of word lines 810 extending in the 8-direction and configured to selectively couple a set of memory cells with a set of digit lines 815. The substrate 840 may further include a set of transistors 805 arranged in one or more rows extending in the x-direction and one or more columns extending in the y-direction. A transistor 805 may be operable to selectively couple an electrode segment 845 with a digit line 815. For example, a word line 810 may be configured to bias a gate of the transistor 805 to couple a source terminal and a drain terminal of the transistors 805. In some cases, each transistor 805 may include a contact 835 (e.g., a terminal, such as the source terminal or drain terminal) arranged on an upper surface of the substrate 840, where each electrode segment 845 may be positioned above and in contact with one of the contacts 835. Here, each contact 835 may be in electronic communication with one of the word lines 810 and one of the digit lines 815 (e.g., the word line 810 and the digit line 815 that are configured to bias the gate of the transistor 805 including the contact 835). In some cases, the substrate 840 may include a set of shield lines 830 (e.g., barrier lines) extending in the y-direction arranged between alternating columns of transistors 805. A shield line 830 may act as barrier between pairs of columns of transistors 805, which may mitigate undesirable effects on a first word line 810 if an adjacent second word line 810 is biased, such as a voltage of the second word line 810 activating a transistor 805 coupled with the first word line 810.

The memory cells on the memory die 800 may each be a part of a memory cell pair. That is, each memory cell may, in conjunction with another memory cell that is a part of a same memory cell pair, store a single bit of information 825. For example, if a first memory cell in a memory cell pair stores one logic state (e.g., a 0), the second memory cell in the memory cell pair may store an opposite logic state (e.g., a 1). In the example of the memory die 800, the memory cells in each memory cell pair may be included on the same level and within a single memory array (e.g., as described with reference to FIG. 4). That is, each word line 810 may be coupled with a set of memory cell pairs (e.g., including both memory cells in each memory cell pair).

Additionally, each memory cell in a memory cell pair may include a first memory cell coupled with one digit line 815 and a second memory cell coupled with an adjacent digit line 815. In the example of the memory die 800, the memory cells in each memory cell pair may be separated by one digit line 815. For example, the digit line 815-*d* may be coupled with a first set of memory cells and the digit line 815-*e* may be coupled with a second set of memory cells. Additionally, the memory die 800 may include memory cell pairs with one memory cell from the first set (e.g., coupled with the digit line 815-*d*) and another memory cell from the second set (e.g., coupled with the digit line 815-*e*). In some cases, the memory cells in each memory cell pair being coupled with adjacent digit lines 815 may decrease differences (e.g., charge drift, threshold drift, access differences, voltage characteristics) between the memory cells in each memory cell pair (e.g., as compared to memory cells in a memory cell pair that are each coupled with digit lines 815 that are separated by one or more other digit lines 815).

Each memory cell in a memory cell pair may additionally be coupled with a same plate line 820 (e.g., via a ferroelectric material). For example, the plate line 820-*b* may be coupled with electrode segments 845 (e.g., via the ferroelectric material) in a first row (e.g., positioned above the digit line 815-*b*) and with electrode segments 845 in a second row (e.g., positioned above the digit line 815-*c*). Here, the memory die 800 may include memory cell pairs including a first memory cell coupled with the digit line 815-*b* and a second memory cell coupled with the digit line 815-*c*. In some cases, each memory cell in a pair being coupled with a same plate line 820 may decrease differences (e.g., charge drift, threshold drift, access differences, voltage characteristics) between the memory cells in each memory cell pair (e.g., as compared to memory cells in a memory cell pair that are each coupled with different plate lines 820).

The memory die 800 may include a set of sense amplifiers 850. Additionally, each of the sense amplifiers 850 may be coupled with two digit lines 815. That is, each sense amplifier 850 may be coupled with a first digit line 815 associated with a first set of memory cells and a second (e.g., different) digit line 815 associated with a second set of memory cells. Here, each sense amplifier 850 may be configured to detect single bits of information 825 stored by memory cell pairs each including one memory cell from the first set of memory cells (e.g., coupled with the first digit line 815) and another memory cell from the second set of memory cells (e.g., coupled with the second digit line 815). For example, the sense amplifier 850-*c* may be coupled with a first set of memory cells via the digit line 815-*d* and coupled with a second set of memory cells via second digit line 815-*e*. Here, the sense amplifier 850-*c* may detect single bits of information 825-*c* stored by memory cell pairs including a memory cell coupled with the digit line 815-*d* and a memory cell coupled with the digit line 815-*e*.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 1: An apparatus, including: a memory array on a first level, where a memory cell pair is configured to store a single bit of information and includes a first ferroelectric memory cell and a second ferroelectric memory cell from the memory array; a first digit line coupled with a first plurality of memory cells in the memory array that includes the first ferroelectric memory cell of the memory cell pair; a second digit line coupled with a second plurality of memory cells in the memory array that includes the second ferroelectric memory cell of the memory cell pair; a word line coupled with a third plurality of memory cells in the memory array that includes the first ferroelectric memory cell and the second ferroelectric memory cell of the memory cell pair; and a sense amplifier coupled with the first digit line and the second digit line, and configured to detect the single bit of information stored by the memory cell pair.

Aspect 2: The apparatus of aspect 1, where the first digit line and the second digit line are associated with a same address of the memory array.

Aspect 3: The apparatus of any of aspects 1 through 2, where the first digit line coupled with the sense amplifier is adjacent to the second digit line coupled with the sense amplifier in the memory array.

Aspect 4: The apparatus of any of aspects 1 through 3, where the first ferroelectric memory cell of the memory cell pair is adjacent to the second ferroelectric memory cell of the memory cell pair in the memory array.

Aspect 5: The apparatus of any of aspects 1 through 4, further including: a second memory array on a second level positioned above the first level, where a second memory cell pair includes a third ferroelectric memory cell and a fourth ferroelectric memory cell from the second memory array, and where the second memory cell pair is configured to store a second single bit of information.

Aspect 6: The apparatus of aspect 5, further including: a third digit line coupled with a fourth plurality of memory cells in the second memory array including the third ferroelectric memory cell of the second memory cell pair; a fourth digit line coupled with a fifth plurality of memory cells in the second memory array including the fourth ferroelectric memory cell of the second memory cell pair; a second word line coupled with a sixth plurality of memory cells in the second memory array including the third ferroelectric memory cell and the fourth ferroelectric memory cell of the second memory cell pair; and a second sense amplifier coupled with the third digit line and the fourth digit line and configured to detect the second single bit of information stored by the second memory cell pair.

Aspect 7: The apparatus of any of aspects 1 through 6, where: the first ferroelectric memory cell includes a first switching component and a first capacitor; and the second ferroelectric memory cell includes a second switching component and a second capacitor.

Aspect 8: The apparatus of any of aspects 1 through 7, where the sense amplifier is configured to: receive a first voltage from the first digit line corresponding to the first ferroelectric memory cell; and receive a second voltage from the second digit line corresponding to the second ferroelectric memory cell, where detecting the single bit of information stored by the memory cell pair is based at least in part on a difference between the first voltage and the second voltage.

An apparatus is described. The following provides an overview of aspects of the apparatus as described herein:

Aspect 9: An apparatus, including: a first memory array on a first level; a second memory array on the first level, where a memory cell pair is configured to store a single bit of information and includes a first ferroelectric memory cell from the first memory array and a second ferroelectric memory cell from the second memory array; a first digit line coupled with a first plurality of memory cells in the first memory array that includes the first ferroelectric memory cell of the memory cell pair; a second digit line coupled with a second plurality of memory cells in the second memory array that includes the second ferroelectric memory cell in the memory cell pair; a first word line associated with an address and coupled with a third plurality of memory cells in the first memory array that includes the first ferroelectric memory cell of the memory cell pair; a second word line associated with the address and coupled with a fourth plurality of memory cells in the second memory array that includes the second ferroelectric memory cell of the memory cell pair; and a sense amplifier coupled with the first digit line and the second digit line, and configured to detect the single bit of information stored by the memory cell pair.

Aspect 10: The apparatus of aspect 9, where the first digit line and the second digit line are associated with a same address of the apparatus.

Aspect 11: The apparatus of any of aspects 9 through 10, where: a first distance between the first ferroelectric memory cell and the sense amplifier is equivalent to a second distance between the second ferroelectric memory cell and the sense amplifier.

Aspect 12: The apparatus of any of aspects 9 through 11, further including: a third memory array on a second level positioned above the first level; and a fourth memory array on the second level, where a second memory cell pair includes a third ferroelectric memory cell from the third memory array and a fourth ferroelectric memory cell from the fourth memory array, and where the second memory cell pair is configured to store a second single bit of information.

Aspect 13: The apparatus of aspect 12, further including: a third digit line coupled with a fifth plurality of memory cells in the third memory array including the third ferroelectric memory cell of the second memory cell pair; a fourth digit line coupled with a sixth plurality of memory cells in the fourth memory array including the fourth ferroelectric memory cell in the second memory cell pair; a third word line associated with a second address and coupled with a seventh plurality of memory cells in the third memory array including the third ferroelectric memory cell of the second memory cell pair; a fourth word line associated with the second address and coupled with a eighth plurality of memory cells in the fourth memory array including the fourth ferroelectric memory cell of the second memory cell pair; and a second sense amplifier coupled with the third digit line and the fourth digit line and configured to detect the second single bit of information stored by the second memory cell pair.

Aspect 14: The apparatus of any of aspects 9 through 13, where: the first ferroelectric memory cell includes a first switching component and a first capacitor; and the second ferroelectric memory cell includes a second switching component and a second capacitor.

Aspect 15: The apparatus of any of aspects 9 through 14, where the sense amplifier is configured to: receive a first voltage from the first digit line corresponding to the first ferroelectric memory cell; and receive a second voltage from the second digit line corresponding to the second ferroelectric memory cell, where detecting the single bit of information stored by the memory cell pair is based at least in part on a difference between the first voltage and the second voltage.

An apparatus is described. The following provides an overview of aspects of the apparatus as described herein:

Aspect 16: An apparatus, including: a first memory array on a first level; a second memory array on a second level different than the first level, where a memory cell pair is configured to store a single bit of information and includes a first ferroelectric memory cell from the first memory array and a second ferroelectric memory cell from the second memory array; a first digit line coupled with a first plurality of memory cells in the first memory array that includes the first ferroelectric memory cell of the memory cell pair; a second digit line coupled with a second plurality of memory cells in the second memory array that includes the second ferroelectric memory cell of the memory cell pair; a word line coupled with a third plurality of memory cells in the first memory array that includes the first ferroelectric memory cell of the memory cell pair and a fourth plurality of memory cells in the second memory array that includes the second ferroelectric memory cell of the memory cell pair; and a sense amplifier coupled with the first digit line and the second digit line, and configured to detect the single bit of information stored by the memory cell pair.

Aspect 17: The apparatus of aspect 16, where the first digit line and the second digit line are associated with a same address of the apparatus.

Aspect 18: The apparatus of any of aspects 16 through 17, further including: a digit line driver coupled with both the first digit line of the first level and the second digit line of the second level and configured to drive a signal over the first digit line and the second digit line in response to receiving a command associated with a single address.

Aspect 19: The apparatus of any of aspects 16 through 18, where the sense amplifier is configured to: receive a first voltage from the first digit line corresponding to the first ferroelectric memory cell; and receive a second voltage from the second digit line corresponding to the second ferroelectric memory cell, where detecting the single bit of information stored by the memory cell pair is based at least in part on a difference between the first voltage and the second voltage.

An apparatus is described. The following provides an overview of aspects of the apparatus as described herein:

Aspect 20: An apparatus, including: a plurality of contacts in electronic communication with one of a plurality of digit lines extending in a first direction and with one of a plurality of word lines extending in a second direction; a plurality of electrodes positioned above the plurality of contacts, the plurality of electrodes comprising a lower surface covering a portion of a respective one of the plurality of contacts and a sidewall perpendicular to the lower surface; a first portion of a dielectric material extending above the plurality of contacts in the first direction between a first row of the plurality of electrodes positioned above a first digit line and a second row of the plurality of electrodes positioned above a second digit line adjacent to the first digit line, where the first portion of the dielectric material is in contact with sidewalls of the plurality of electrodes in the first row and the plurality of electrodes in the second row; a first portion of a conductive material extending above the plurality of contacts in the first direction and in contact with a first portion of a ferroelectric material that is positioned between the first portion of the conductive material and the plurality of electrodes in the first row; and a second portion of the conductive material extending above the plurality of contacts in the first direction and in contact with a second portion of the ferroelectric material that is distinct from the first portion of the ferroelectric material and positioned between the second portion of the conductive material and the plurality of electrodes in the second row, where the second portion of the conductive material is isolated from the first portion of the conductive material.

Aspect 21: The apparatus of aspect 20, further including: a second portion of the dielectric material extending above the plurality of contacts in the first direction between a third row of the plurality of electrodes positioned above a third digit line adjacent to the second digit line and a fourth row of the plurality of electrodes positioned above a fourth digit line adjacent to the third digit line, where the second portion of the dielectric material is in contact with sidewalls of the plurality of electrodes in the third row and sidewalls of the plurality of electrodes in the fourth row, where: the second portion of the conductive material is in contact with the second portion of the ferroelectric material that is positioned between the second portion of the conductive material and the plurality of electrodes in the third row; and the second portion of the conductive material is in contact with a third portion of the ferroelectric material that is distinct from the second portion of the ferroelectric material and positioned between the second portion of the conductive material and the plurality of electrodes in the fourth row.

Aspect 22: The apparatus of aspect 21, further including: a sense amplifier in electronic communication with the second digit line and the fourth digit line and configured to detect a single bit of information stored in a memory cell pair based at least in part on a difference between a first voltage of the second digit line and a second voltage of the fourth digit line.

Aspect 23: The apparatus of any of aspects 20 through 22, further including: a third row of the plurality of electrodes positioned above a third digit line adjacent to the second digit line, where: the second portion of the ferroelectric material conformally lines lower surfaces and sidewalls of the plurality of electrodes in the second row and the third row; and the second portion of the conductive material is in contact with the second portion of the ferroelectric material that is positioned between the second portion of the conductive material and the plurality of electrodes in the third row.

Aspect 24: The apparatus of aspect 23, further including: a sense amplifier in electronic communication with the second digit line and the third digit line and configured to detect a single bit of information stored in a memory cell pair based at least in part on a difference between a first voltage of the second digit line and a second voltage of the third digit line.

Aspect 25: The apparatus of any of aspects 20 through 24, further including: a second portion of the dielectric material extending above the first portion of the dielectric material and isolating the first portion of the conductive material from the second portion of the conductive material.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components.

In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory array comprising an array of memory cells positioned on a first level, wherein a memory cell pair is configured to store a single bit of information and comprises a first ferroelectric memory cell and a second ferroelectric memory cell from the memory array, wherein the memory array is below a second memory array comprising an array of memory cells positioned on a second level positioned above the first level;
a first digit line coupled with a first plurality of memory cells in the memory array that includes the first ferroelectric memory cell of the memory cell pair;
a second digit line coupled with a second plurality of memory cells in the memory array that includes the second ferroelectric memory cell of the memory cell pair;
a word line coupled with a third plurality of memory cells in the memory array that includes the first ferroelectric memory cell and the second ferroelectric memory cell of the memory cell pair;
one or more dedicated shield lines between one or more sets of switching components associated with the memory array; and
a sense amplifier coupled with the first digit line and the second digit line, and configured to detect the single bit of information stored by the memory cell pair.

2. The apparatus of claim 1, wherein the first digit line and the second digit line are associated with a same address of the memory array.

3. The apparatus of claim 1, wherein the first digit line coupled with the sense amplifier is adjacent to the second digit line coupled with the sense amplifier in the memory array.

4. The apparatus of claim 1, wherein the first ferroelectric memory cell of the memory cell pair is adjacent to the second ferroelectric memory cell of the memory cell pair in the memory array.

5. The apparatus of claim 1, further comprising:
the second memory array on the second level positioned above the first level, wherein a second memory cell pair comprises a third ferroelectric memory cell and a fourth ferroelectric memory cell from the second memory array, and wherein the second memory cell pair is configured to store a second single bit of information.

6. The apparatus of claim 5, further comprising:
a third digit line coupled with a fourth plurality of memory cells in the second memory array including the third ferroelectric memory cell of the second memory cell pair;
a fourth digit line coupled with a fifth plurality of memory cells in the second memory array including the fourth ferroelectric memory cell of the second memory cell pair;
a second word line coupled with a sixth plurality of memory cells in the second memory array including the third ferroelectric memory cell and the fourth ferroelectric memory cell of the second memory cell pair; and
a second sense amplifier coupled with the third digit line and the fourth digit line and configured to detect the second single bit of information stored by the second memory cell pair.

7. The apparatus of claim 1, wherein:
the first ferroelectric memory cell comprises a first switching component and a first capacitor; and
the second ferroelectric memory cell comprises a second switching component and a second capacitor.

8. The apparatus of claim 1, wherein the sense amplifier is configured to:
receive a first voltage from the first digit line corresponding to the first ferroelectric memory cell; and
receive a second voltage from the second digit line corresponding to the second ferroelectric memory cell, wherein detecting the single bit of information stored by the memory cell pair is based at least in part on a difference between the first voltage and the second voltage.

9. An apparatus, comprising:
a first memory array comprising an array of memory cells positioned on a first level;
a second memory array comprising an array of memory cells positioned on the first level, wherein a memory cell pair is configured to store a single bit of information and comprises a first ferroelectric memory cell from the first memory array and a second ferroelectric memory cell from the second memory array, wherein the first memory array and the second memory array are below one or more memory arrays comprising one or more arrays of memory cells positioned on a second level positioned above the first level;
a first digit line coupled with a first plurality of memory cells in the first memory array that includes the first ferroelectric memory cell of the memory cell pair;
a second digit line coupled with a second plurality of memory cells in the second memory array that includes the second ferroelectric memory cell in the memory cell pair;
a first word line associated with an address and coupled with a third plurality of memory cells in the first memory array that includes the first ferroelectric memory cell of the memory cell pair;
a second word line associated with the address and coupled with a fourth plurality of memory cells in the second memory array that includes the second ferroelectric memory cell of the memory cell pair;
one or more dedicated shield lines between one or more sets of switching components associated with the first memory array, the second memory array, or both; and
a sense amplifier coupled with the first digit line and the second digit line, and configured to detect the single bit of information stored by the memory cell pair.

10. The apparatus of claim 9, wherein the first digit line and the second digit line are associated with a same address of the apparatus.

11. The apparatus of claim 9, wherein:
a first distance between the first ferroelectric memory cell and the sense amplifier is equivalent to a second distance between the second ferroelectric memory cell and the sense amplifier.

12. The apparatus of claim 9, further comprising:
a third memory array on the second level positioned above the first level; and
a fourth memory array on the second level, wherein a second memory cell pair comprises a third ferroelectric memory cell from the third memory array and a fourth ferroelectric memory cell from the fourth memory array, and wherein the second memory cell pair is configured to store a second single bit of information.

13. The apparatus of claim 12, further comprising:
a third digit line coupled with a fifth plurality of memory cells in the third memory array including the third ferroelectric memory cell of the second memory cell pair;
a fourth digit line coupled with a sixth plurality of memory cells in the fourth memory array including the fourth ferroelectric memory cell in the second memory cell pair;
a third word line associated with a second address and coupled with a seventh plurality of memory cells in the third memory array including the third ferroelectric memory cell of the second memory cell pair;
a fourth word line associated with the second address and coupled with an eighth plurality of memory cells in the fourth memory array including the fourth ferroelectric memory cell of the second memory cell pair; and
a second sense amplifier coupled with the third digit line and the fourth digit line and configured to detect the second single bit of information stored by the second memory cell pair.

14. The apparatus of claim 9, wherein:
the first ferroelectric memory cell comprises a first switching component and a first capacitor; and
the second ferroelectric memory cell comprises a second switching component and a second capacitor.

15. The apparatus of claim 9, wherein the sense amplifier is configured to:
receive a first voltage from the first digit line corresponding to the first ferroelectric memory cell; and
receive a second voltage from the second digit line corresponding to the second ferroelectric memory cell, wherein detecting the single bit of information stored by the memory cell pair is based at least in part on a difference between the first voltage and the second voltage.

16. An apparatus, comprising:
a first memory array comprising an array of memory cells positioned on a first level;
a second memory array comprising an array of memory cells positioned on a second level different than the first level, wherein a memory cell pair is configured to store a single bit of information and comprises a first ferroelectric memory cell from the first memory array and a second ferroelectric memory cell from the second memory array;
a first digit line coupled with a first plurality of memory cells in the first memory array that includes the first ferroelectric memory cell of the memory cell pair;
a second digit line coupled with a second plurality of memory cells in the second memory array that includes the second ferroelectric memory cell of the memory cell pair;
a word line coupled with a third plurality of memory cells in the first memory array that includes the first ferroelectric memory cell of the memory cell pair and a fourth plurality of memory cells in the second memory array that includes the second ferroelectric memory cell of the memory cell pair;
one or more dedicated shield lines between one or more sets of switching components associated with the first memory array, the second memory array, or both; and
a sense amplifier coupled with the first digit line and the second digit line, and configured to detect the single bit of information stored by the memory cell pair.

17. The apparatus of claim 16, wherein the first digit line and the second digit line are associated with a same address of the apparatus.

18. The apparatus of claim 16, further comprising:
a digit line driver coupled with both the first digit line of the first level and the second digit line of the second level and configured to drive a signal over the first digit line and the second digit line in response to receiving a command associated with a single address.

19. The apparatus of claim 16, wherein the sense amplifier is configured to:
receive a first voltage from the first digit line corresponding to the first ferroelectric memory cell; and
receive a second voltage from the second digit line corresponding to the second ferroelectric memory cell, wherein detecting the single bit of information stored by the memory cell pair is based at least in part on a difference between the first voltage and the second voltage.

20. An apparatus, comprising:
a plurality of contacts in electronic communication with one of a plurality of digit lines extending in a first direction and with one of a plurality of word lines extending in a second direction;
a plurality of electrodes positioned above the plurality of contacts, the plurality of electrodes comprising a lower surface covering a portion of a respective one of the plurality of contacts and a sidewall perpendicular to the lower surface;

a first portion of a dielectric material extending above the plurality of contacts in the first direction between a first row of the plurality of electrodes positioned above a first digit line and a second row of the plurality of electrodes positioned above a second digit line adjacent to the first digit line, wherein the first portion of the dielectric material is in contact with sidewalls of the plurality of electrodes in the first row and the plurality of electrodes in the second row;

a first plate line including a first portion of a conductive material extending above the plurality of contacts in the first direction and in contact with a first portion of a ferroelectric material that is positioned between the first portion of the conductive material and the plurality of electrodes in the first row; and a second plate line including a second portion of the conductive material extending above the plurality of contacts in the first direction and in contact with a second portion of the ferroelectric material that is distinct from the first portion of the ferroelectric material and positioned between the second portion of the conductive material and the plurality of electrodes in the second row, wherein the second portion of the conductive material of the second plate line is isolated from the first portion of the conductive material of the first plate line, wherein the first portion and the second portion of the conductive material form an open circuit between the first portion and the second portion based at least in part on the second portion being isolated from the first portion.

21. The apparatus of claim 20, further comprising:

a second portion of the dielectric material extending above the plurality of contacts in the first direction between a third row of the plurality of electrodes positioned above a third digit line adjacent to the second digit line and a fourth row of the plurality of electrodes positioned above a fourth digit line adjacent to the third digit line, wherein the second portion of the dielectric material is in contact with sidewalls of the plurality of electrodes in the third row and sidewalls of the plurality of electrodes in the fourth row, wherein:

the second portion of the conductive material is in contact with the second portion of the ferroelectric material that is positioned between the second portion of the conductive material and the plurality of electrodes in the third row; and the second portion of the conductive material is in contact with a third portion of the ferroelectric material that is distinct from the second portion of the ferroelectric material and positioned between the second portion of the conductive material and the plurality of electrodes in the fourth row.

22. The apparatus of claim 21, further comprising:

a sense amplifier in electronic communication with the second digit line and the fourth digit line and configured to detect a single bit of information stored in a memory cell pair based at least in part on a difference between a first voltage of the second digit line and a second voltage of the fourth digit line.

23. The apparatus of claim 20, further comprising:

a third row of the plurality of electrodes positioned above a third digit line adjacent to the second digit line, wherein:

the second portion of the ferroelectric material conformally lines lower surfaces and sidewalls of the plurality of electrodes in the second row and the third row; and the second portion of the conductive material is in contact with the second portion of the ferroelectric material that is positioned between the second portion of the conductive material and the plurality of electrodes in the third row.

24. The apparatus of claim 23, further comprising:

a sense amplifier in electronic communication with the second digit line and the third digit line and configured to detect a single bit of information stored in a memory cell pair based at least in part on a difference between a first voltage of the second digit line and a second voltage of the third digit line.

25. The apparatus of claim 20, further comprising:

a second portion of the dielectric material extending above the first portion of the dielectric material and isolating the first portion of the conductive material from the second portion of the conductive material.

* * * * *